United States Patent
Ono

(10) Patent No.: US 8,743,342 B2
(45) Date of Patent: Jun. 3, 2014

(54) REFLECTIVE IMAGING OPTICAL SYSTEM, EXPOSURE APPARATUS, AND METHOD FOR PRODUCING DEVICE

(75) Inventor: Takuro Ono, Okegawa (JP)

(73) Assignee: Nikon Corporation, Tokyo (JP)

( * ) Notice: Subject to any disclaimer, the term of this patent is extended or adjusted under 35 U.S.C. 154(b) by 597 days.

(21) Appl. No.: 12/943,236

(22) Filed: Nov. 10, 2010

(65) Prior Publication Data

US 2011/0116062 A1    May 19, 2011

Related U.S. Application Data

(60) Provisional application No. 61/272,901, filed on Nov. 17, 2009.

(51) Int. Cl.
*G03B 27/42* (2006.01)

(52) U.S. Cl.
USPC .............. 355/53; 355/55; 355/63; 355/67; 355/77

(58) Field of Classification Search
USPC .......... 355/53, 55, 63, 67, 77; 359/861, 365, 359/859, 650, 857, 858; 378/34, 85
See application file for complete search history.

(56) References Cited

U.S. PATENT DOCUMENTS

| | | | |
|---|---|---|---|
| 5,361,292 A * | 11/1994 | Sweatt | 378/34 |
| 6,781,671 B2 | 8/2004 | Komatsuda | |
| 2002/0093636 A1 | 7/2002 | Komatsuda | |
| 2003/0076483 A1 | 4/2003 | Komatsuda | |
| 2003/0086524 A1 * | 5/2003 | Schultz et al. | 378/34 |
| 2007/0296936 A1 | 12/2007 | Kato et al. | |
| 2009/0073392 A1 | 3/2009 | Mann et al. | |
| 2009/0122381 A1 | 5/2009 | Owa et al. | |

FOREIGN PATENT DOCUMENTS

WO    WO 2004/010224 A2    1/2004

OTHER PUBLICATIONS

PCT International Search Report dated Feb. 28, 2011 corresponding to PCT/JP2010/070751.
Takahashi, "Lens Design From Aberration Coefficient to Automated Design," Chapter 2: Lens Configuration, §2.1, pp. 15-16, Tokai University Press, Tokyo, Japan, (Mar. 20, 1994).

\* cited by examiner

*Primary Examiner* — Steven H Whitesell Gordon
*Assistant Examiner* — Mesfin T Asfaw
(74) *Attorney, Agent, or Firm* — Finnegan, Henderson, Farabow, Garrett & Dunner, LLP

(57) ABSTRACT

An imaging optical system of the far pupil type, which is applicable to an exposure apparatus, is provided with six reflecting mirrors and forms an image of a first plane on a second plane. An incident pupil of the imaging optical system is positioned on a side opposite to the imaging optical system with the first plane intervening therebetween. A condition of $-14.3 < (PD/TT)/R \leftarrow 8.3$ is fulfilled by a distance PD which is provided along an optical axis between the incident pupil and the first plane, a distance TT which is provided along the optical axis between the first plane and the second plane, and an angle of incidence R (rad) of a main light beam which comes into the first plane.

20 Claims, 12 Drawing Sheets

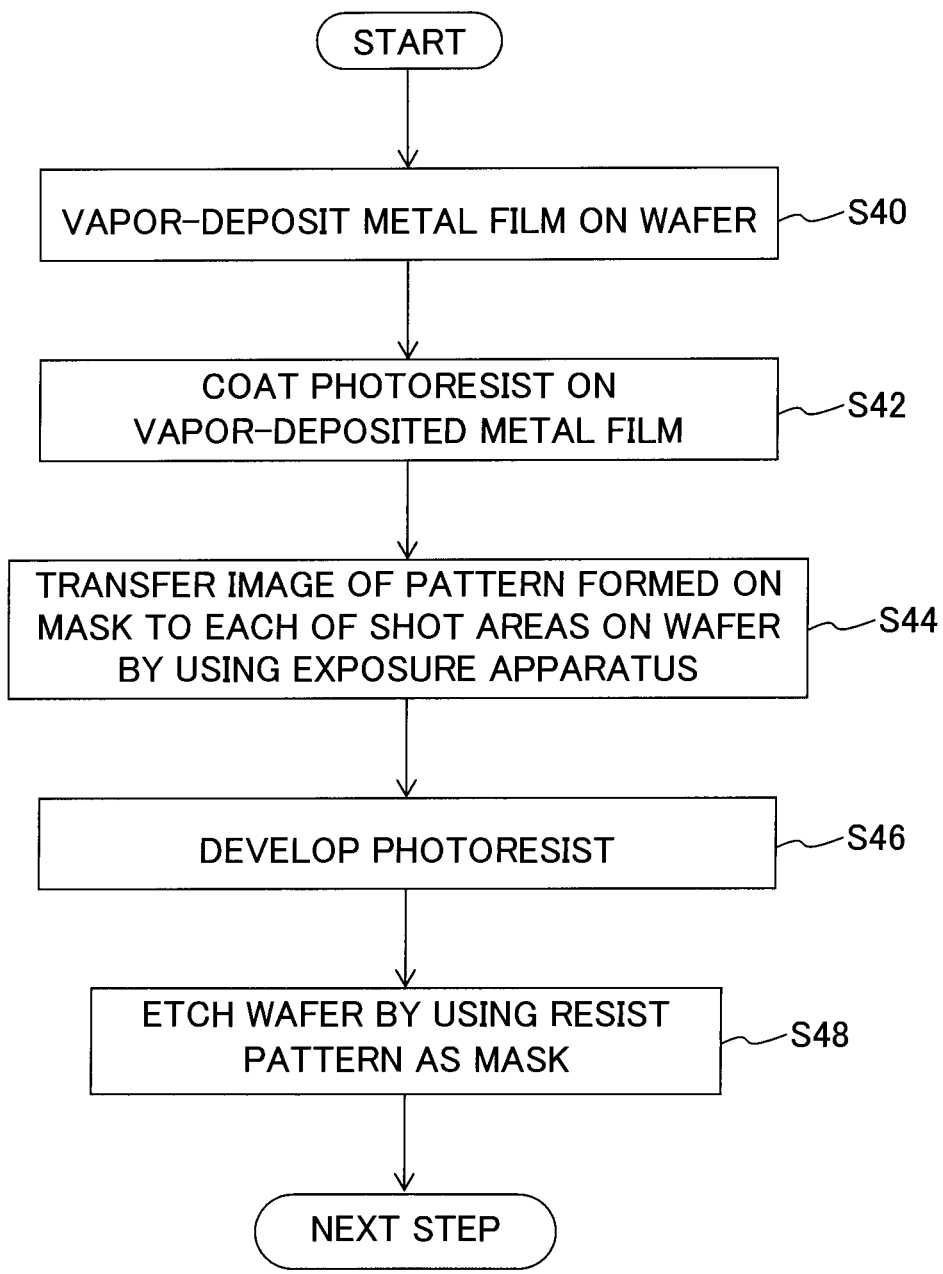

REFLECTIVE IMAGING OPTICAL SYSTEM, EXPOSURE APPARATUS, AND METHOD FOR PRODUCING DEVICE

CROSS-REFERENCE TO RELATED APPLICATION

This application claims the benefit of priority of U.S. Provisional Application Ser. No. 61/272,901 filed on Nov. 17, 2009, and the disclosure of U.S. Provisional Application Ser. No. 61/272,901 is incorporated herein by reference in its entirety.

BACKGROUND OF THE INVENTION

1. Field of the Invention

The present invention relates to a reflective (catoptric) imaging optical system, an exposure apparatus, and a method for producing a device. In particular, the present invention relates to a reflective imaging optical system preferably useable for an exposure apparatus which uses the EUV light (EUV light beam) and transfers, onto a photosensitive substrate, a circuit pattern on a mask for example in accordance with the mirror projection system.

2. Description of the Related Art

Attention is directed to an EUVL (Extreme UltraViolet Lithography) exposure apparatus which uses the EUV (Extreme UltraViolet) light having a wavelength of, for example, about 5 to 40 nm as an exposure apparatus to be used for producing semiconductor elements, etc. In a case that the EUV light is used as the exposure light (exposure light beam), any usable transmissive optical material and any useable dioptric optical material are absent. Therefore, a reflection type mask is used, and a reflective optical system (optical system constructed of only reflecting members) is used as a projection optical system.

Conventionally, it has been suggested that a reflective optical system, which has an incident pupil disposed on a side opposite to the optical system with an object plane intervening therebetween, is used as a reflective imaging optical system applicable to a projection optical system of an EUVL exposure apparatus, in place of a reflective optical system which has an incident pupil disposed on a side of the optical system with an object plane intervening therebetween (see, for example, U.S. Pat. No. 6,781,671). In the following description of this specification, the "reflective imaging optical system having the incident pupil disposed on the side of the optical system with the object plane intervening therebetween" is referred to as "reflective imaging optical system of the near pupil type", and the "reflective imaging optical system having the incident pupil disposed on the side opposite to the optical system with the object plane intervening therebetween" is referred to as "reflective imaging optical system of the far pupil type". In other word, the former is also referred to as "reflective imaging optical system of the normal pupil type" and the latter is also referred to as "reflective imaging optical system of the opposite pupil type".

When the reflective imaging optical system of the near pupil type is adopted as the projection optical system of the EUVL exposure apparatus, it is necessary that a condenser optical system is arranged in an optical path between a mask and an optical integrator in an illumination optical system. Therefore, the optical efficiency (light efficiency) is lowered due to the increase in the number of mirrors. On the contrary, when the reflective imaging optical system of the far pupil type is adopted, it is unnecessary to arrange any condenser optical system. Therefore, it is possible to enhance the optical efficiency owing to the reduction of the number of mirrors.

However, with respect to the reflective imaging optical system of the far pupil type disclosed in the U.S. Pat. No. 6,781,671, a distance which is provided along the optical axis between the incident pupil and the object plane (hereinafter simply referred to as "incident pupil distance" as well) is relatively short. Therefore, any overlay error (overlap error) tends to arise in relation to respective illumination fields formed on the mask by respective light fluxes subjected to the wavefront division by a first fly's eye optical system of the optical integrator. Consequently, the light amount loss tends to arise. If only the incident pupil distance is simply lengthened in the reflective imaging optical system of the far pupil type, then the distance from the optical axis of the effective field on the object plane of the reflective imaging optical system is excessively increased, and it is difficult to satisfactorily correct the aberration.

The present invention has been made taking the foregoing problems into consideration, an object of which is to provide a reflective imaging optical system of the far pupil type as a reflective optical system applicable, for example, to an exposure apparatus using the EUV light wherein the incident pupil distance is secured to be relatively large and the aberration is satisfactorily corrected. Another object of the present invention is to perform the projection exposure at a high resolution while securing a large resolving power by using, for example, the EUV light as an exposure light, with the application of the reflective imaging optical system of the far pupil type of the present invention to a projection optical system of an exposure apparatus.

SUMMARY OF THE INVENTION

In order to solve the problems as described above, according to a first aspect of the present invention, there is provided a reflective imaging optical system which forms, on a second plane, an image of an object arranged on a first plane, the reflective imaging optical system comprising: an incident pupil which is positioned on a side opposite to the reflective imaging optical system with the first plane intervening therebetween; wherein the following condition is fulfilled provided that PD represents a distance along an optical axis between the incident pupil and the first plane, TT represents a distance along the optical axis between the first plane and the second plane, and R represents an angle of incidence (rad) of a main light beam coming into the first plane:

$$-14.3 < (PD/TT)/R \leftarrow 8.3$$

According to a second aspect of the present invention, there is provided an exposure apparatus comprising: an illumination optical system which illuminates a predetermined pattern as the object arranged on the first plane with a light from a light source, and the reflective imaging optical system as defined in the first aspect which projects the predetermined pattern onto a photosensitive substrate arranged on the second plane.

According to a third aspect of the present invention, there is provided a method for producing a device, comprising: exposing the photosensitive substrate with the predetermined pattern by using the exposure apparatus as defined in the second aspect; developing the photosensitive substrate to which the predetermined pattern has been transferred to form a mask layer, which has a shape corresponding to the predetermined pattern, on a surface of the photosensitive substrate; and processing the surface of the photosensitive substrate via the mask layer.

In the present invention, in the reflective imaging optical system which is provided as the optical system of the far pupil type, the required condition is fulfilled by the distance PD which is provided along the optical axis between the incident pupil and the first plane, the distance TT which is provided along the optical axis between the first plane and the second plane, and the angle of incidence of the main light beam which comes (is allowed to come) into the first plane. Accordingly, it is possible to realize the reflective imaging optical system of the far pupil type in which the incident pupil distance is secured to be relatively large and the aberration is satisfactorily corrected. As a result, the overlay error (overlap error) of the respective illumination fields can be suppressed to be small in the illumination optical system which is used in combination with the reflective imaging optical system of the present invention.

In a case that the reflective imaging optical system of the present invention is applied to the exposure apparatus, the EUV light (EUV light beam), which has a wavelength of, for example, 5 nm to 40 nm, can be used as the exposure light (exposure light beam). In this case, the pattern of the mask can be projected onto the photosensitive substrate to expose the photosensitive substrate therewith at a high resolution by relatively moving the photosensitive substrate and the pattern of the mask to be transferred relative to the reflective imaging optical system. As a result, a highly accurate device can be produced under the satisfactory exposure condition by using the scanning type exposure apparatus having a large resolving power.

BRIEF DESCRIPTION OF THE DRAWINGS

FIG. 12 shows a flow chart concerning an exemplary technique adopted when a semiconductor device is obtained as a microdevice by way of example.

DESCRIPTION OF THE PREFERRED EMBODIMENTS

Figure 1:
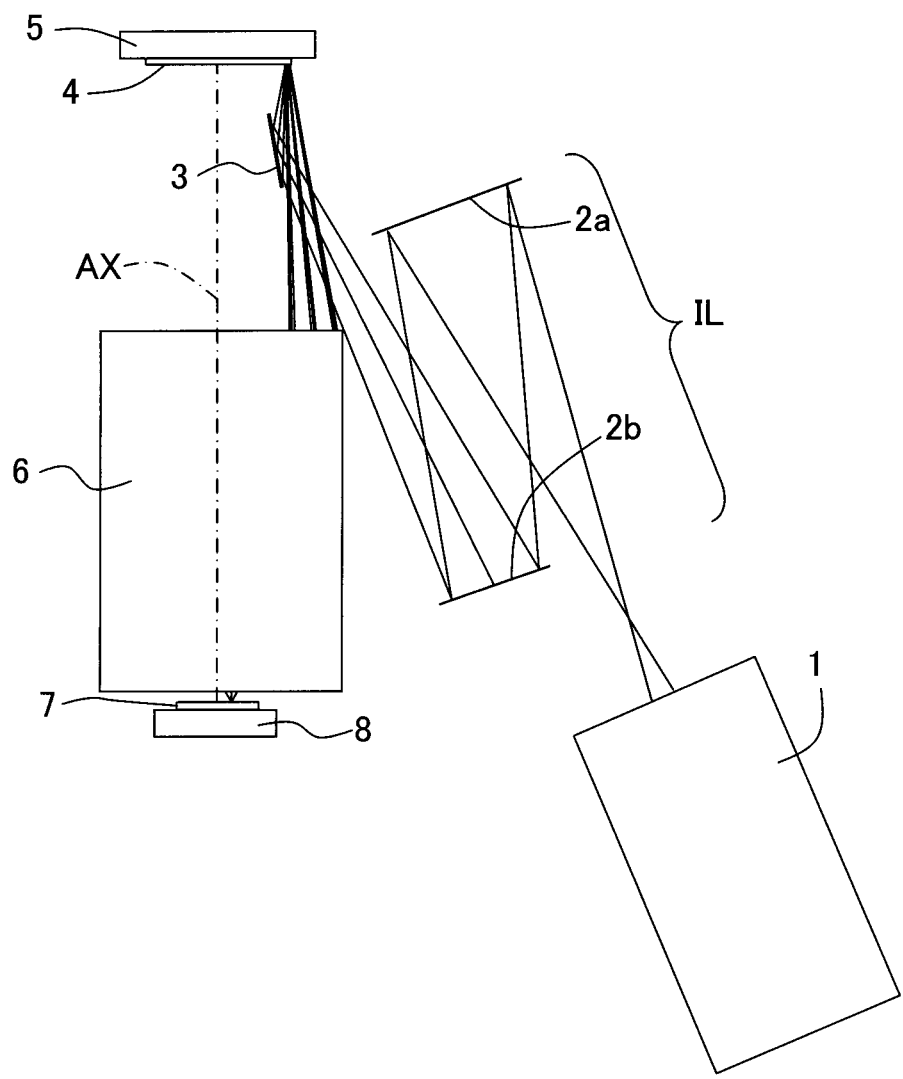
FIG. 1 schematically shows a construction of an exposure apparatus according to an embodiment of the present invention.
Figure 2:
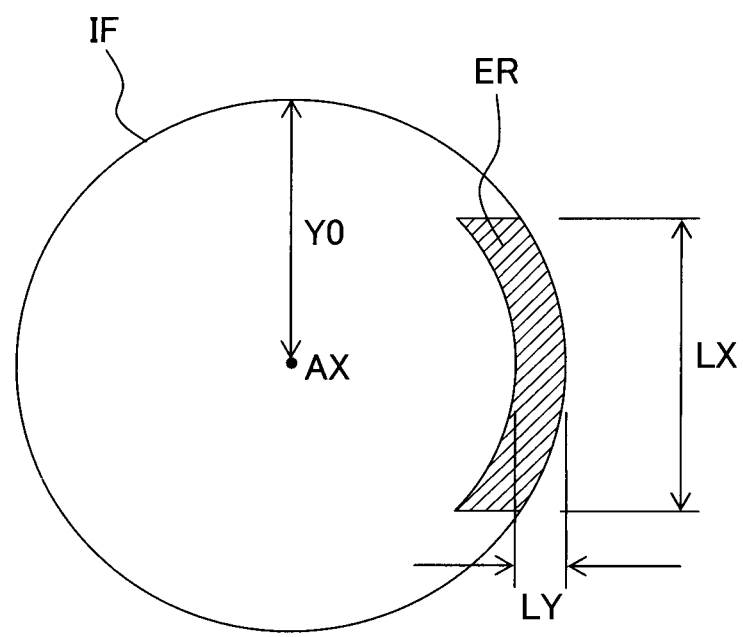
FIG. 2 shows a positional relationship between an optical axis and a circular arc-shaped effective imaging area formed on a wafer.
Figure 2:
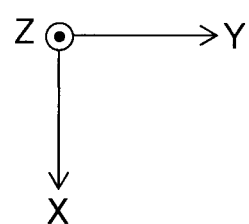

An embodiment of the present invention will be explained based on the accompanying drawings. FIG. 1 schematically shows a construction of an exposure apparatus according to the embodiment of the present invention. FIG. 2 shows a positional relationship between an optical axis and a circular arc-shaped effective imaging area formed on a wafer. In FIG. 1, the Z axis is defined in the direction of the optical axis AX of a reflective imaging optical system 6, i.e., in the normal line direction of an exposure surface (transfer surface) of the wafer 7 provided as a photosensitive substrate, the Y axis is defined in the direction parallel to the sheet surface of FIG. 1 in the exposure surface of the wafer 7, and the X axis is defined in the direction perpendicular to the sheet surface of FIG. 1 in the exposure surface of the wafer 7.

With reference to FIG. 1, a light source 7 which is provided to supply the exposure light includes, for example, a laser plasma X-ray source. Those usable as the light source 1 include discharge plasma light sources and other X-ray sources. The light (light beam) radiated from the light source 1 comes into an illumination optical system IL, via an optionally arranged wavelength selection filter (not shown). The wavelength selection filter has such a characteristic that only the EUV light having a predetermined wavelength (for example, 13.5 nm), which is included in the lights supplied by the light source 1, is selectively transmitted through the wavelength selection filter, and the transmission of the lights having other wavelengths is shielded or shut off by the wavelength selection filter. The EUV light via (which is allowed to pass through) the wavelength selection filter is guided to an optical integrator which is constructed of a pair of fly's eye optical systems (fly's eye mirrors) 2a, 2b.

The first fly's eye optical system 2a has a plurality of first reflecting optical elements which are arranged in juxtaposition or in parallel. The second fly's eye optical system 2b has a plurality of second reflecting optical elements which are arranged in juxtaposition or in parallel to correspond to the plurality of first reflecting optical elements of the first fly's eye optical system 2a. Specifically, the first fly's eye optical system 2a is constructed, for example, by arranging a large number of concave mirror elements, having circular arc-shaped outer shapes, densely, laterally and longitudinally. The second fly's eye optical system 2b is constructed, for example, by arranging a large number of concave mirror elements, which have rectangular outer shapes, densely, laterally and longitudinally. Reference may be made, for example, to United States Patent Application Publication No. 2002/0093636 A1 about detailed construction and function of the fly's eye optical systems 2a, 2b.

Thus, a substantial surface light source, which has a predetermined shape, is formed in the vicinity of the reflecting surface of the second fly's eye optical system 2b. The substantial surface light source is formed at the position of the exit pupil (exit pupil position) of the illumination optical system IL constructed of the pair of fly's eye optical systems 2a, 2b. The exit pupil position of the illumination optical system IL (i.e., the position in the vicinity of the reflecting surface of the second fly's eye optical system 2b) is coincident with the position of the incident pupil of the reflective imaging optical system (projection optical system) 6 of the far pupil type.

The light from the substantial surface light source, i.e., the light exiting or irradiated from the illumination optical system IL is reflected by an oblique incidence mirror 3, and then the light forms a circular arc-shaped illumination area on a mask 4 via a circular arc-shaped aperture (light-transmitting portion) of a field stop (not shown) which is arranged closely to the reflection type mask 4 substantially in parallel thereto. In this way, the light source 1 and the illumination optical system IL (2a, 2b) constitute an illumination system which is provided to perform the Koehler illumination for the mask 4 provided with a predetermined pattern. No reflecting mirror having any power is arranged in the optical path between the second fly's eye optical system 2b and the mask 4. The power of the reflecting mirror is a reciprocal of the focal length or focal distance of the concerning reflecting mirror. It is a matter of course that the reflecting mirror having any power may be arranged.

The mask 4 is held by a mask stage 5 which is movable in the Y direction so that the pattern surface of the mask 4 extends along the XY plane. The movement of the mask stage 5 is measured by a laser interferometer and an encoder which are omitted from the illustration. For example, a circular arc-shaped illumination area, which is symmetrical in relation to the Y axis, is formed on the mask 4. The light, which comes from the illuminated mask 4, forms a pattern image of the mask 4 on a wafer 7 as a photosensitive substrate, via the reflective imaging optical system 6.

That is, as shown in FIG. 2, a circular arc-shaped effective imaging area (static exposure area) ER, which is symmetrical in relation to the Y axis, is formed on the wafer 7. With reference to FIG. 2, the circular arc-shaped effective imaging area ER, which has a length LX in the X direction and which has a length LY in the Y direction, is formed so that the circular arc-shaped effective imaging area ER is brought in contact with an image circle IF in the circular area (image circle) IF which has a radius Y0 about the center of the optical axis AX. The circular arc-shaped effective imaging area ER is a part of the annular or zonal area provided about the center of the optical axis AX. The length LY is the widthwise dimension of the effective imaging area ER provided in the direction connecting the optical axis and the center of the circular arc-shaped effective imaging area ER.

The wafer 7 is held by a wafer stage 8 which is two-dimensionally movable in the X direction and the Y direction so that the exposure surface of the wafer 7 extends along the XY plane. The movement of the wafer stage 8 is measured by a laser interferometer and an encoder which are omitted from the illustration, in the same manner as the mask stage 5. Thus, the scanning exposure (scanning and exposure) is performed while moving the mask stage 5 and the wafer stage 8 in the Y direction, i.e., relatively moving the mask 4 and the wafer 7 in the Y direction with respect to the reflective imaging optical system 6. By doing so, the pattern of the mask 4 is transferred to an exposure area of the wafer 7.

In this case, when the projection magnification (transfer magnification) of the reflective imaging optical system 6 is ¼, the synchronous scanning is performed by setting the movement velocity of the wafer stage 8 to ¼ of the movement velocity of the mask stage 5. The pattern of the mask 4 is successively transferred to the respective exposure areas of the wafer 7 by repeating the scanning exposure while two-dimensionally moving the wafer stage 8 in the X direction and the Y direction.

Figure 3:
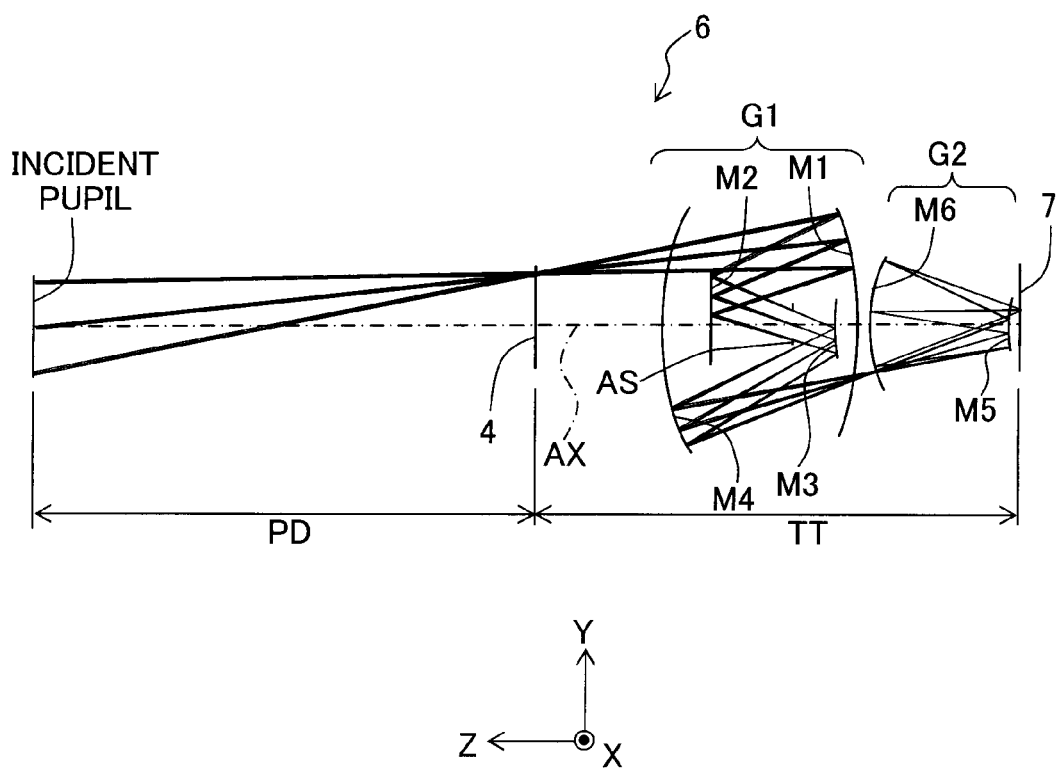
FIG. 3 schematically shows a basic construction of reflective imaging optical systems according to respective specified embodiments concerning the embodiment of the present invention.

In the embodiment of the present invention, as shown in FIG. 3, the reflective imaging optical system 6 concerning each of specified embodiments includes a first reflective optical system G1 which is provided to form an intermediate image of the pattern at a position optically conjugate with the pattern surface of the mask 4; and a second reflective optical system G2 which is provided to form, on the wafer 7, a final reduced image (image of the intermediate image) of the pattern of the mask 4, along the single optical axis AX extending in a form of straight line. That is, the plane, which is optically conjugate with the pattern surface of the mask 4, is formed in the optical path between the first reflective optical system G1 and the second reflective optical system G2.

The first reflective optical system G1 includes a first reflecting mirror M1 which has a concave (concave surface-shaped) reflecting surface, a second reflecting mirror M2 which has a convex (convex surface-shaped) or concave reflecting surface, a third reflecting mirror M3 which has a convex reflecting surface, and a fourth reflecting mirror M4 which has a concave reflecting surface as referred to in an order of the incidence of the light. The second reflective optical system G2 includes a fifth reflecting mirror M5 which has a convex reflecting surface, and a sixth reflecting mirror M6 which has a concave reflecting surface as referred to in an order of the incidence of the light. An aperture stop AS is provided in the optical path ranging from the second reflecting mirror M2 to the third reflecting mirror M3. Any aperture stop other than the aperture stop AS is not arranged in the optical path of the reflective imaging optical system 6. The numerical aperture of the reflective imaging optical system 6 is determined by only the limitation of the light flux by the aperture stop AS.

In the respective specified embodiments, the light, which comes from an area (illumination area) separated from the optical axis AX on the pattern surface of the mask 4 (first plane), is successively reflected by the concave reflecting surface of the first reflecting mirror M1, the convex or concave reflecting surface of the second reflecting mirror M2, the convex reflecting surface of the third reflecting mirror M3, and the concave reflecting surface of the fourth reflecting surface M4, and then the light forms the intermediate image of the mask pattern. The light, which comes from the intermediate image formed via the first reflective optical system G1, is successively reflected by the convex reflecting surface of the fifth reflecting mirror M5 and the concave reflecting surface of the sixth reflecting mirror M6, and then the light forms the reduced image of the mask pattern in an area (effective imaging area ER) separated from the optical axis AX on the surface of the wafer 7 (second plane).

In the respective specified embodiments, the reflective imaging optical system 6 includes the six reflecting mirrors M1 to M6 in which the centers of curvature of the reflecting surfaces are arranged on the same axis (on the optical axis AX). That is, the reflective imaging optical system 6 is provided with the six reflecting mirrors N1 to M6, and all of the six reflecting mirrors M1 to M6 are provided so that the centers of curvature of the reflecting surfaces are arranged on the same axis (on the optical axis AX). All of the reflecting mirrors M1 to M6 have the reflecting surfaces each of which is formed along the rotationally symmetric surface in relation to the optical axis AX. In the respective specified embodiments, the reflective imaging optical system 6 is the optical system which is substantially telecentric on the side of the wafer (on the side of the image). In other words, in the respective specified embodiments, the main light beam, which arrives at the respective positions on the image plane of the reflective imaging optical system 6, is substantially perpendicular to the image plane. Owing to this construction, the imaging can be performed satisfactorily even when irregularities (protrusions and recesses) are present on the wafer within the depth of focus of the reflective imaging optical system 6.

In the embodiment of the present invention, the reflective imaging optical system 6 concerning each of the specified embodiments is the reflective imaging optical system of the far pupil type which has the incident pupil, at the position separated by a predetermined distance, on the side opposite to the reflective imaging optical system 6 with the mask 4 intervening therebetween. The incident pupil distance PD, which relates to the reflective imaging optical system of the far pupil type, corresponds to the focal length of the condenser optical system of the illumination optical system to be used in combination with the reflective imaging optical system of the near pupil type. In the illumination optical system to be used in combination with the reflective imaging optical system of the near pupil type, by setting the focal length of the condenser optical system to be relatively large, it is possible to suppress the overlay error to be small for the respective illumination fields formed on the mask by the respective light fluxes subjected to the wavefront division by the plurality of circular arc-shaped reflecting mirror elements constructing the first fly's eye optical system.

Therefore, in the illumination optical system to be used in combination with the reflective imaging optical system of the far pupil type, by securing the incident pupil distance PD of the reflective imaging optical system be relatively large, it is possible to suppress the overlay error to be small for the respective illumination fields. In order to secure the large incident pupil distance PD in the reflective imaging optical system of the far pupil type, it is necessary that the absolute value of the angle of incidence R of the main light beam coming into the center of the effective field on the object side (mask side) is suppressed to be small, or that the center of the effective field is separated relatively largely from the optical axis.

The reflection type mask is used in the EUVL exposure apparatus. Therefore, if the absolute value of the angle of incidence R of the main light beam coming into the mask surface (pattern surface of the mask) is made to be excessively small (is excessively decreased), it is difficult to separate the light flux coming into the mask from the light flux reflected by the mask. Therefore, in order to secure the large incident pupil distance PD while maintaining the angle of incidence R of the main light beam coming into the mask surface within the required angle range, it is necessary that the center of the effective field is separated from the optical axis relatively largely. However, as the distance between the optical axis and the center of the effective field is larger, the correction of the aberration of the reflective imaging optical system becomes more difficult.

In the embodiment of the present invention, the following conditional expression (1) is fulfilled by the distance PD along the optical axis between the mask surface (first plane) and the incident pupil of the reflective imaging optical system of the far pupil type, the distance TT along the optical axis between the mask surface and the wafer surface (transfer surface of the wafer: second plane), and the angle of incidence R (rad) of the main light beam coming into the mask surface. It is presumed that the angle of incident R takes a negative value in a case that the main light beam coming into the mask surface is positioned to rotate counterclockwise from the optical axis AX, as shown in FIG. 3. Note that it is also allowable to presume that the angle of incident R takes a negative value in a case that the main light beam reflected by the mask surface is positioned to rotate counterclockwise from the optical axis AX.

$$-14.3 < (PD/TT)/R \leftarrow 8.3 \quad (1)$$

If the ratio PD/TT of the incident pupil distance PD with respect to the total length TT of the reflective imaging optical system is excessively decreased (is made to be excessively small), then the distance between the optical axis and the center of the effective field is decreased, and it is difficult to separate the respective reflecting mirrors of the reflective imaging optical system and the light flux allowed to pass along the vicinity thereof. If it is intended to avoid the interference between the respective reflecting mirrors and the light flux in a state that the PD/TT is small, then the curvatures of the reflecting surfaces of the respective reflecting mirrors are strengthened, the angles of incidence of the light coming into the respective reflecting mirrors are increased, and the reflectances of the respective reflecting mirrors are consequently lowered, for the following reason. That is, in the reflective imaging optical system using the EUV light, the reflecting surface of each of the reflecting mirrors is formed of a multilayer film, and it is required to decrease the angle of incidence of the light coming into each of the reflecting mirrors as small as possible in order to enhance the reflectance on each of the reflecting mirrors. On the contrary, if PD/TT is excessively increased (is made to be excessively large), then the distance between the optical axis and the center of the effective field is increased, and it is difficult to correct the aberration of the reflective imaging optical system, although it is easy to separate the light flux from each of the reflecting mirrors.

On the other hand, even when the distance between the optical axis and the center of the effective field is increased, if the absolute value of the angle of incidence R of the main light beam coming into the mask surface is excessively increased, then the incident pupil distance PD is decreased, and the large overlay error is consequently generated for the respective illumination fields. On the contrary, if the absolute value of the angle of incidence R of the main light beam coming into the mask surface is excessively decreased, then it is difficult to avoid the interference between the incident light flux coming into the mask and the reflected light flux exiting from the mask, although the incident pupil distance PD is increased and it is easy to decrease the overlay error of the respective illumination fields.

In the embodiment of the present invention, the conditional expression (1) is fulfilled by the incident pupil distance PD, the total length TT of the optical system, and the angle of incidence R of the main light beam coming into the mask surface, and thus it is possible to realize the reflective imaging optical system of the far pupil type in which the incident pupil distance PD is secured to be relatively large and the aberration is corrected satisfactorily. As a result, in the illumination optical system to be used in combination with the reflective imaging optical system of the embodiment of the present invention, the overlay error can be suppressed to be small for the respective illumination fields. In order to exhibit the effect of the embodiment of the present invention more satisfactorily, the upper limit value of the conditional expression (1) can be set to −8.6. Further, in order to exhibit the effect of the embodiment of the present invention more satisfactorily, the lower limit value of the conditional expression (1) can be set to −13.7.

In the respective specified embodiments concerning the embodiment of the present invention, the aspherical surface is expressed by the following numerical expression (a) provided that y represents the height in the direction perpendicular to the optical axis, z represents the distance (sag amount) along the optical axis from the tangent plane, at the apex of the aspherical surface, to the position on the aspherical surface at the height y, r represents the apex radius of curvature, κ represents the conical coefficient, and $C_n$ represents the n-order aspherical coefficient.

$$z = (y^2/r)/\{1 + \{1 - (1+\kappa) \cdot y^2/r^2\}^{1/2}\} + C_4 \cdot y^4 + C_6 \cdot y^6 + C_8 \cdot Y^8 + C_{10} \cdot y^{10} + C_{12} \cdot y^{12} + C_{14} \cdot y^{14} + C_{16} \cdot y^{16} + C_{18} \cdot y^{18} \quad (a)$$

First Embodiment

Figure 4:
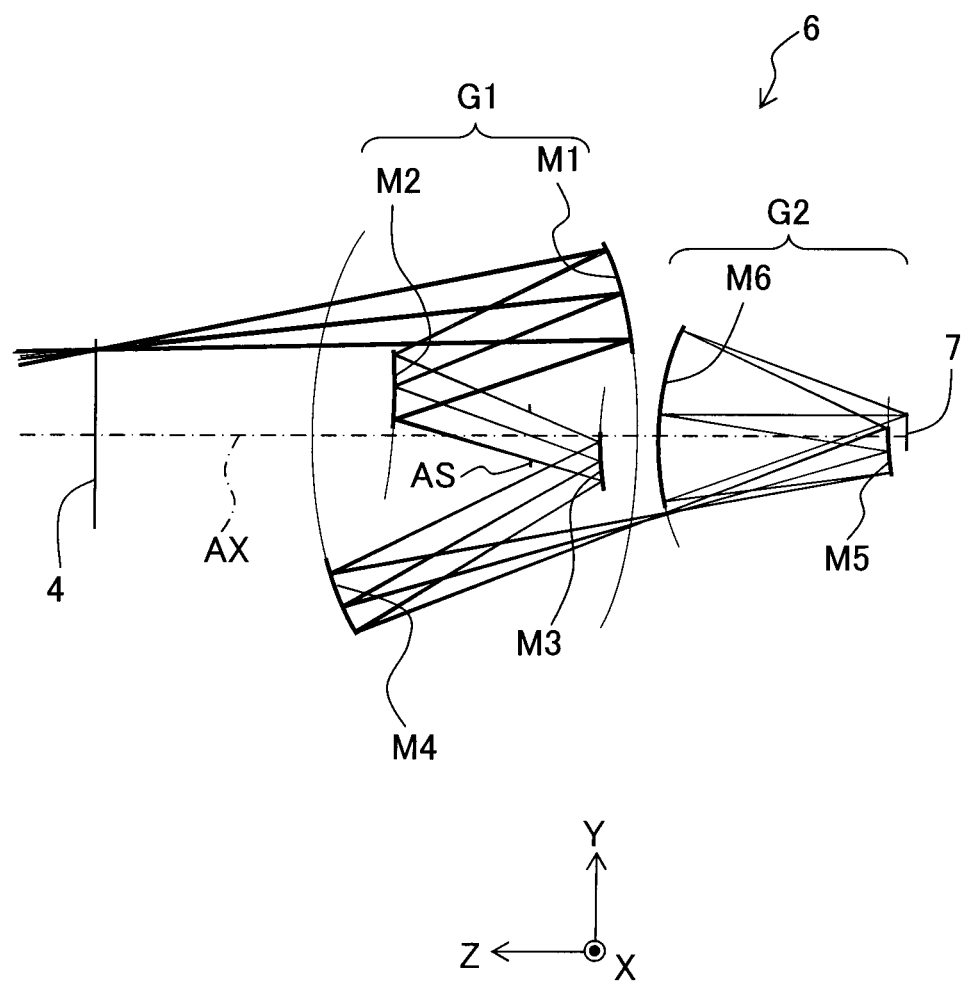
FIG. 4 schematically shows a construction of a reflective imaging optical system according to a first embodiment.

FIG. 4 shows a construction of a reflective imaging optical system according to a first embodiment of the embodiment of the present invention. With reference to FIG. 4, in the reflective imaging optical system of the first embodiment, the light from the mask 4 is successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed. The light from the intermediate image formed via the first reflective optical system G1 is successively reflected by the convex reflecting surface of the fifth reflecting mirror M5 and the concave reflecting surface of the sixth reflecting mirror M6, and then the reduced image (secondary image) of the mask pattern is formed on the wafer 7.

Table 1 described below shows values of items or elements of the reflective imaging optical system according to the first embodiment. In the columns of the major items shown in Table 1, λ, represents the wavelength of the exposure light, β represents the magnitude of the imaging magnification, NA represents the numerical aperture on the image side (wafer side), Y0 represents the radius (maximum image height) of the image circle IF on the wafer 7, LX represents the size or dimension in the X direction of the effective imaging area ER, and LY represents the size or dimension in the Y direction of the effective imaging area ER (widthwise dimension of the circular arc-shaped effective imaging area ER).

In the columns of the optical member items shown in Table 1, the surface number represents the sequence or order of the reflecting surface as counted from the mask side in the direction in which the light travels from the mask surface as the object plane (pattern surface of the mask 4) to the wafer surface as the image plane (transfer surface of the wafer 7), r represents the apex radius of curvature of each of the reflecting surfaces (center radius of curvature: mm), and d represents the spacing distance on the axis of each of the reflecting surfaces, i.e., the inter-surface spacing (mm). The sign of the inter-surface spacing d is changed every time when the reflection occurs. In the direction toward the mask, the radius of curvature of the convex surface is positive, and the radius of curvature of the concave surface is negative, irrelevant to the direction of the incidence of the light.

In the columns of the values corresponding to the conditional expression shown in Table 1, PD represents the distance (incident pupil distance) along the optical axis between the incident pupil and the mask surface, TT represents the distance (total length) along the optical axis between the mask surface and the wafer surface, and R represents the angle of incidence (rad) of the main light beam coming into the mask surface. The foregoing notation also holds in Tables 2 to 8 described later on in the same manner as described above.

TABLE 1

Major Items:

$\lambda = 13.5$ nm
$\beta = \frac{1}{4}$
NA = 0.35
Y0 = 53.45 mm
LX = 26 mm
LY = 1.5 mm

TABLE 1-continued

Optical Member Items:

| Surface No. | r | d | Optical member |
|---|---|---|---|
|  | (mask surface) | 1296.22 |  |
| 1 | −1377.55 | −583.38 | (first reflecting mirror M1) |
| 2 | −5200.08 | 325.04 | (second reflecting mirror M2) |
|  |  | 168.34 | (aperture stop AS) |
| 3 | 746.75 | −695.56 | (third reflecting mirror M3) |
| 4 | 1054.95 | 1388.18 | (fourth reflecting mirror M4) |
| 5 | 606.82 | −552.62 | (fifth reflecting mirror M5) |
| 6 | 664.95 | 600.28 | (sixth reflecting mirror M6) |
|  | (wafer surface) |  |  |

Aspherical Data:

First Surface:

$\kappa = 2.823 \times 10^{-2}$
$C_4 = 2.080 \times 10^{-11}$   $C_6 = 1.928 \times 10^{-17}$
$C_8 = 1.115 \times 10^{-22}$   $C_{10} = -1.442 \times 10^{-27}$
$C_{12} = 1.189 \times 10^{-32}$   $C_{14} = -5.297 \times 10^{-38}$
$C_{16} = 1.246 \times 10^{-43}$   $C_{18} = -1.212 \times 10^{-49}$ Second Surface:

$\kappa = -8.020$
$C_4 = 5.770 \times 10^{-10}$   $C_6 = -1.124 \times 10^{-15}$
$C_8 = -9.397 \times 10^{-21}$   $C_{10} = 9.707 \times 10^{-25}$
$C_{12} = -3.641 \times 10^{-29}$   $C_{14} = 7.470 \times 10^{-34}$
$C_{16} = -8.172 \times 10^{-39}$   $C_{18} = 3.734 \times 10^{-44}$ Third Surface:

$\kappa = -1.285 \times 10$
$C_4 = -2.004 \times 10^{-9}$   $C_6 = 4.865 \times 10^{-14}$
$C_8 = -1.422 \times 10^{-18}$   $C_{10} = 5.719 \times 10^{-23}$
$C_{12} = -3.085 \times 10^{-27}$   $C_{14} = 1.399 \times 10^{-31}$
$C_{16} = -3.934 \times 10^{-36}$   $C_{18} = 5.063 \times 10^{-41}$ Fourth Surface:

$\kappa = -3.161 \times 10^{-2}$
$C_4 = -2.024 \times 10^{-12}$   $C_6 = -4.878 \times 10^{-17}$
$C_8 = 1.015 \times 10^{-22}$   $C_{10} = 6.735 \times 10^{-28}$
$C_{12} = -7.840 \times 10^{-33}$   $C_{14} = 3.165 \times 10^{-38}$
$C_{16} = -6.183 \times 10^{-44}$   $C_{18} = 4.813 \times 10^{-50}$ Fifth Surface:

$\kappa = 0$
$C_4 = 5.038 \times 10^{-9}$   $C_6 = 5.070 \times 10^{-14}$
$C_8 = 9.761 \times 10^{-19}$   $C_{10} = -1.829 \times 10^{-23}$
$C_{12} = 2.011 \times 10^{-27}$   $C_{14} = -4.616 \times 10^{-32}$
$C_{16} = 0$   $C_{18} = 0$ Sixth Surface:

$\kappa = -7.735 \times 10^{-2}$
$C_4 = 4.697 \times 10^{-11}$   $C_6 = 1.510 \times 10^{-16}$
$C_8 = 3.076 \times 10^{-22}$   $C_{10} = 6.945 \times 10^{-28}$
$C_{12} = 1.882 \times 10^{-33}$   $C_{14} = 3.503 \times 10^{-39}$
$C_{16} = 0$   $C_{18} = 0$ Values Corresponding to Conditional Expression:

PD = 2000 mm
TT = 2000 mm
R = −0.105 rad
(1) (PD/TT)/R = −9.5

In relation to the reflective imaging optical system of the first embodiment, the value of RMS (root mean square: quadratic square mean) of the wavefront aberration was determined for the respective points in the circular arc-shaped effective imaging area ER. As a result, the maximum value (worst value) was 0.0353λ (λ: wavelength of light=13.5 nm). That is, in the first embodiment, it is possible to secure the relatively large numerical aperture on the image side of 0.35, and it is possible to secure the circular arc-shaped effective imaging area of 26 mm×1.5 mm in which the various aberrations are satisfactorily corrected on the wafer 7.

In the first embodiment, the maximum angle of incidence into each of the reflecting mirrors is not more than 25 degrees. As a result, the reflectance is relatively high in relation to the multilayer film constructing the reflecting surface of each of the reflecting mirrors. Consequently, the light amount loss, which is caused by the reflection in the reflective imaging optical system, can be suppressed to be small. When the maximum angle of incidence into each of the reflecting mirrors is suppressed to be small, it tends to be difficult to avoid the interference between each of the reflecting mirrors and the light flux allowed to pass along the vicinity thereof. However, in the first embodiment, the spacing distance of not less than 8 mm is secured between each of the reflecting mirrors and the light flux allowed to pass along the vicinity thereof, although the maximum angle of incidence into each of the reflecting mirrors is suppressed to be small.

Second Embodiment

Figure 5:
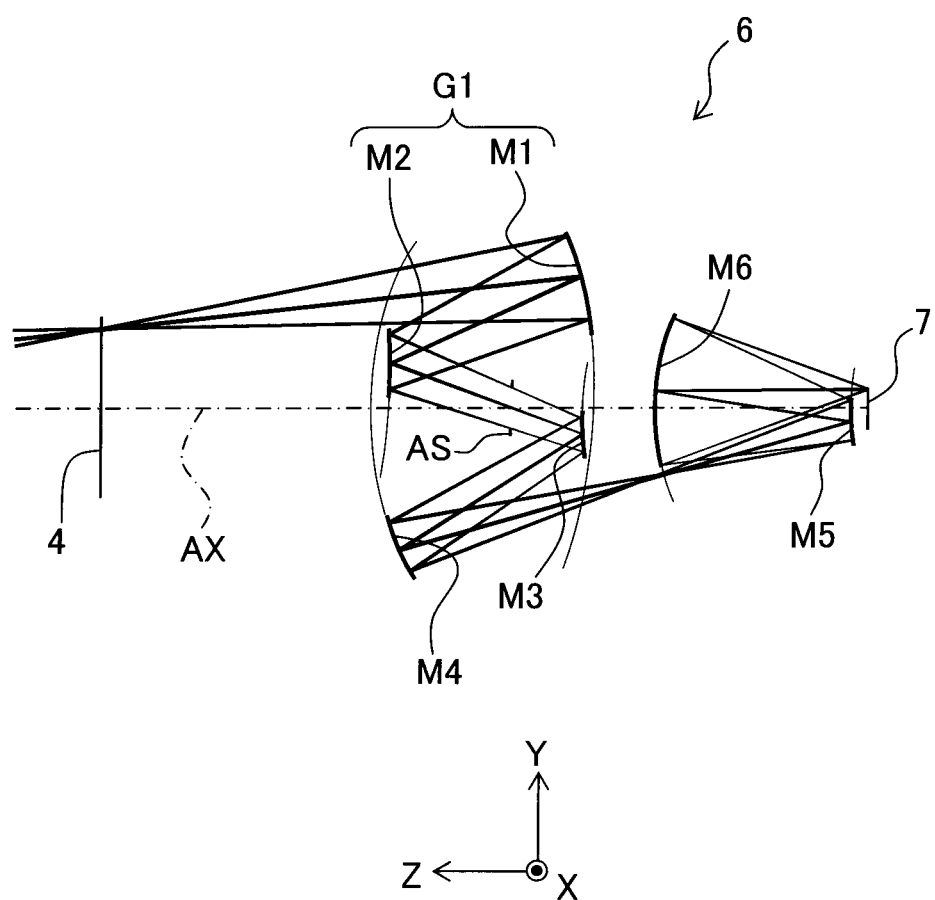
FIG. 5 schematically shows a construction of a reflective imaging optical system according to a second embodiment.

FIG. 5 shows a construction of a reflective imaging optical system according to a second embodiment of the embodiment of the present invention. With reference to FIG. 5, the light from the mask 4 is also successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed in the second embodiment in the same manner as in the first embodiment. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 2 described below shows values of items or elements of the reflective imaging optical system according to the second embodiment.

TABLE 2

Major Items:

$\lambda = 13.5$ nm
$\beta = \frac{1}{4}$
NA = 0.35
Y0 = 50.75 mm
LX = 26 mm
LY = 1.5 mm Optical Member Items:

| Surface No. | r | d | Optical member |
|---|---|---|---|
|  | (mask surface) | 1302.53 |  |
| 1 | −1264.43 | −530.89 | (first reflecting mirror M1) |
| 2 | −3198.75 | 311.75 | (second reflecting mirror M2) |
|  |  | 179.92 | (aperture stop AS) |
| 3 | 630.76 | −541.62 | (third reflecting mirror M3) |
| 4 | 880.99 | 1231.94 | (fourth reflecting mirror M4) |
| 5 | 589.97 | −501.10 | (fifth reflecting mirror M5) |
| 6 | 608.76 | 547.47 | (sixth reflecting mirror M6) |
|  | (wafer surface) |  |  |

Aspherical Data:

First Surface:

$\kappa = 0$
$C_4 = 2.606 \times 10^{-11}$
$C_6 = 3.598 \times 10^{-17}$
$C_8 = -4.689 \times 10^{-23}$
$C_{10} = 4.608 \times 10^{-28}$ TABLE 2-continued $C_{12} = -9.418 \times 10^{-34}$
$C_{14} = -2.485 \times 10^{-41}$
$C_{16} = 2.320 \times 10^{-45}$
$C_{18} = 0$ Second Surface:

$\kappa = 0$
$C_4 = 8.197 \times 10^{-10}$
$C_6 = -2.264 \times 10^{-15}$
$C_8 = 1.331 \times 10^{-20}$
$C_{10} = 4.063 \times 10^{-26}$
$C_{12} = -6.489 \times 10^{-30}$
$C_{14} = 1.195 \times 10^{-34}$
$C_{16} = -7.330 \times 10^{-40}$
$C_{18} = 0$ Third Surface:

$\kappa = 0$
$C_4 = -7.292 \times 10^{-9}$
$C_6 = 1.050 \times 10^{-13}$
$C_8 = -1.871 \times 10^{-18}$
$C_{10} = 1.461 \times 10^{-23}$
$C_{12} = 1.046 \times 10^{-27}$
$C_{14} = -5.549 \times 10^{-32}$
$C_{16} = 9.524 \times 10^{-37}$
$C_{18} = 0$ Fourth Surface:

$\kappa = 0$
$C_4 = -3.020 \times 10^{-11}$
$C_6 = 1.023 \times 10^{-16}$
$C_8 = -1.724 \times 10^{-21}$
$C_{10} = 1.183 \times 10^{-26}$
$C_{12} = -5.195 \times 10^{-32}$
$C_{14} = 1.264 \times 10^{-37}$
$C_{16} = -1.344 \times 10^{-43}$
$C_{18} = 0$ Fifth Surface:

$\kappa = 0$
$C_4 = 5.947 \times 10^{-9}$
$C_6 = 6.675 \times 10^{-14}$
$C_8 = 7.648 \times 10^{-19}$
$C_{10} = 1.677 \times 10^{-22}$
$C_{12} = -2.838 \times 10^{-26}$
$C_{14} = 2.536 \times 10^{-30}$
$C_{16} = -8.671 \times 10^{-35}$
$C_{18} = 0$ Sixth Surface:

$\kappa = 0$
$C_4 = 2.097 \times 10^{-11}$
$C_6 = 1.288 \times 10^{-16}$
$C_8 = 3.348 \times 10^{-22}$
$C_{10} = 3.976 \times 10^{-28}$
$C_{12} = 1.821 \times 10^{-32}$
$C_{14} = -1.838 \times 10^{-37}$
$C_{16} = 9.582 \times 10^{-43}$
$C_{18} = 0$ Values Corresponding to Conditional Expression:

PD = 1900 mm
TT = 2000 mm
R = −0.105 rad
(1) (PD/TT)/R = −9.0

In relation to the reflective imaging optical system of the second embodiment, the maximum value (worst value) of RMS of the wavefront aberration was $0.0352\lambda$ ($\lambda$: wavelength of light=13.5 nm). That is, also in the second embodiment, it is possible to secure the relatively large numerical aperture on the image side of 0.35, and it is possible to secure the circular arc-shaped effective imaging area of 26 mm×1.5 mm in which the various aberrations are satisfactorily corrected on the wafer 7, in the same manner as in the first embodiment.

In the second embodiment, the ratio PD/TT of the incident pupil distance PD with respect to the total length TT of the reflective imaging optical system is slightly smaller than that of the first embodiment. Therefore, the maximum angle of incidence into each of the reflecting mirrors is slightly larger than that of the first embodiment. Specifically, in the second embodiment, the maximum angle of incidence into each of the reflecting mirrors is not more than 26.7 degrees. As a result, also in the second embodiment, the reflectance is relatively high in relation to the multilayer film constructing the reflecting surface of each of the reflecting mirrors. Consequently, the light amount loss, which is caused by the reflection in the reflective imaging optical system, can be suppressed to be small. Further, in the second embodiment, the spacing distance of not less than 8 mm is secured between each of the reflecting mirrors and the light flux allowed to pass along the vicinity thereof, in the same manner as in the first embodiment.

Third Embodiment

Figure 6:
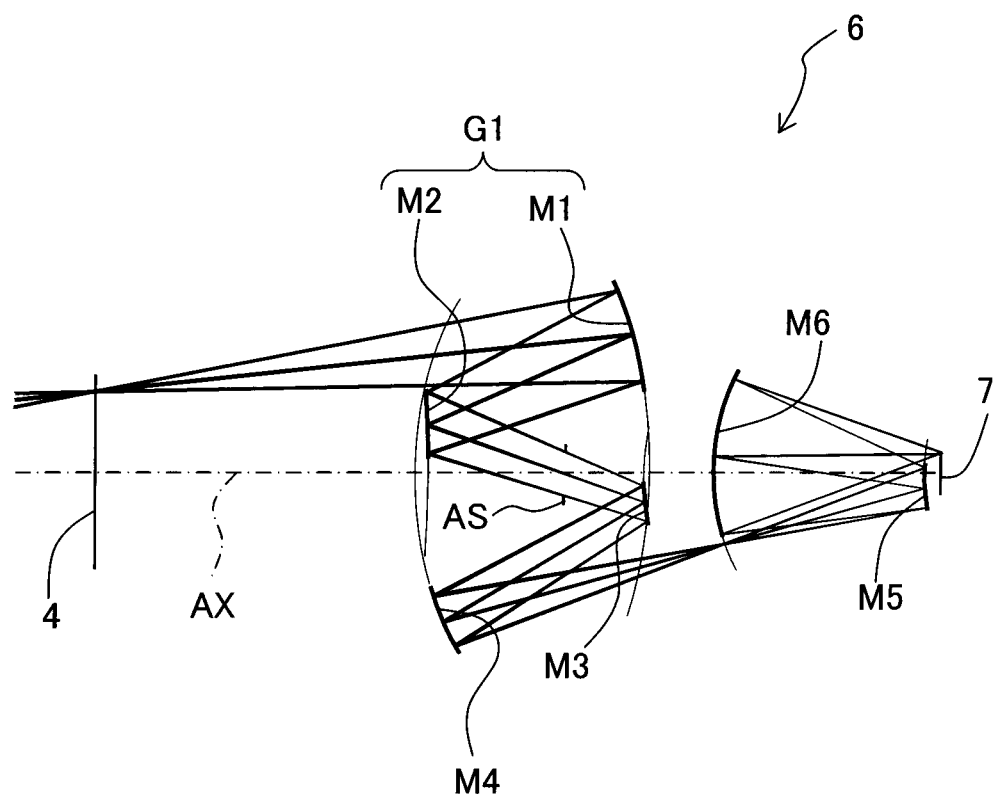
FIG. 6 schematically shows a construction of a reflective imaging optical system according to a third embodiment.

FIG. 6 shows a construction of a reflective imaging optical system according to a third embodiment of the embodiment of the present invention. With reference to FIG. 6, the light from the mask 4 is also successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed in the third embodiment in the same manner as in the first and second embodiments. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 3 described below shows values of items or elements of the reflective imaging optical system according to the third embodiment.

TABLE 3

Major Items:

$\lambda$ = 13.5 nm
$\beta$ = ¼
NA = 0.35
Y0 = 49.25 mm
LX = 26 mm
LY = 1.5 mm

Optical Member Items:

| Surface No. | r | d | Optical member |
|---|---|---|---|
|  | (mask surface) | 1309.66 |  |
| 1 | −1264.27 | −525.87 | (first reflecting mirror M1) |
| 2 | −3096.74 | 324.37 | (second reflecting mirror M2) |
|  |  | 186.38 | (aperture stop AS) |
| 3 | 650.35 | −543.01 | (third reflecting mirror M3) |
| 4 | 880.29 | 1207.50 | (fourth reflecting mirror M4) |
| 5 | 574.15 | −499.37 | (fifth reflecting mirror M5) |
| 6 | 601.80 | 540.34 | (sixth reflecting mirror M6) |
|  | (wafer surface) |  |  |

Aspherical Data:

First Surface:

$\kappa = 0$
$C_4 = 2.415 \times 10^{-11}$    $C_6 = 3.098 \times 10^{-17}$
$C_8 = -5.961 \times 10^{-24}$   $C_{10} = 9.990 \times 10^{-29}$
$C_{12} = 7.751 \times 10^{-34}$  $C_{14} = -4.450 \times 10^{-39}$
$C_{16} = 7.045 \times 10^{-45}$  $C_{18} = 0$ Second Surface:

$\kappa = 0$
$C_4 = 7.217 \times 10^{-10}$    $C_6 = -1.514 \times 10^{-15}$
$C_8 = 8.264 \times 10^{-22}$    $C_{10} = 3.515 \times 10^{-25}$
$C_{12} = -1.178 \times 10^{-29}$ $C_{14} = 1.668 \times 10^{-34}$
$C_{16} = -8.942 \times 10^{-40}$ $C_{18} = 0$ Third Surface:

$\kappa = 0$
$C_4 = -6.715 \times 10^{-9}$    $C_6 = 8.839 \times 10^{-14}$
$C_8 = -1.280 \times 10^{-18}$   $C_{10} = -1.356 \times 10^{-23}$
$C_{12} = 2.345 \times 10^{-27}$  $C_{14} = -9.368 \times 10^{-32}$
$C_{16} = 1.447 \times 10^{-36}$  $C_{18} = 0$ Fourth Surface:

$\kappa = 0$
$C_4 = -2.825 \times 10^{-11}$   $C_6 = 9.153 \times 10^{-17}$
$C_8 = -1.682 \times 10^{-21}$   $C_{10} = 1.214 \times 10^{-26}$ TABLE 3-continued $C_{12} = -5.553 \times 10^{-32}$ $C_{14} = 1.396 \times 10^{-37}$
$C_{16} = -1.524 \times 10^{-43}$ $C_{18} = 0$ Fifth Surface:

$\kappa = 0$
$C_4 = 6.324 \times 10^{-9}$     $C_6 = 7.812 \times 10^{-14}$
$C_8 = 4.904 \times 10^{-19}$    $C_{10} = 2.898 \times 10^{-22}$
$C_{12} = -4.598 \times 10^{-26}$ $C_{14} = 3.940 \times 10^{-30}$
$C_{16} = -1.320 \times 10^{-34}$ $C_{18} = 0$ Sixth Surface:

$\kappa = 0$
$C_4 = 2.136 \times 10^{-11}$    $C_6 = 1.303 \times 10^{-16}$
$C_8 = 3.613 \times 10^{-22}$    $C_{10} = 8.861 \times 10^{-29}$
$C_{12} = 2.816 \times 10^{-32}$  $C_{14} = -3.012 \times 10^{-37}$
$C_{16} = 1.533 \times 10^{-42}$  $C_{18} = 0$ Values Corresponding to Conditional Expression:

PD = 1840 mm
TT = 2000 mm
R = −0.105 rad
(1) (PD/TT)/R = −8.8

In relation to the reflective imaging optical system of the third embodiment, the maximum value (worst value) of RMS of the wavefront aberration was 0.0496$\lambda$ ($\lambda$: wavelength of light=13.5 nm). In the third embodiment, the ratio PD/TT of the incident pupil distance PD with respect to the total length TT of the reflective imaging optical system is further decreased as compared with the second embodiment. The maximum value of RMS of the wavefront aberration is larger than those of the first and second embodiments, on account of the relationship of trade-off between the restriction or limitation of the maximum angle of incidence into each of the reflecting mirrors and the light flux separation from each of the reflecting mirrors. However, also in the third embodiment, it is possible to secure the relatively large numerical aperture on the image side of 0.35, and it is possible to secure the circular arc-shaped effective imaging area of 26 mm×1.5 mm in which the various aberrations are satisfactorily corrected on the wafer 7.

Fourth Embodiment

Figure 7:
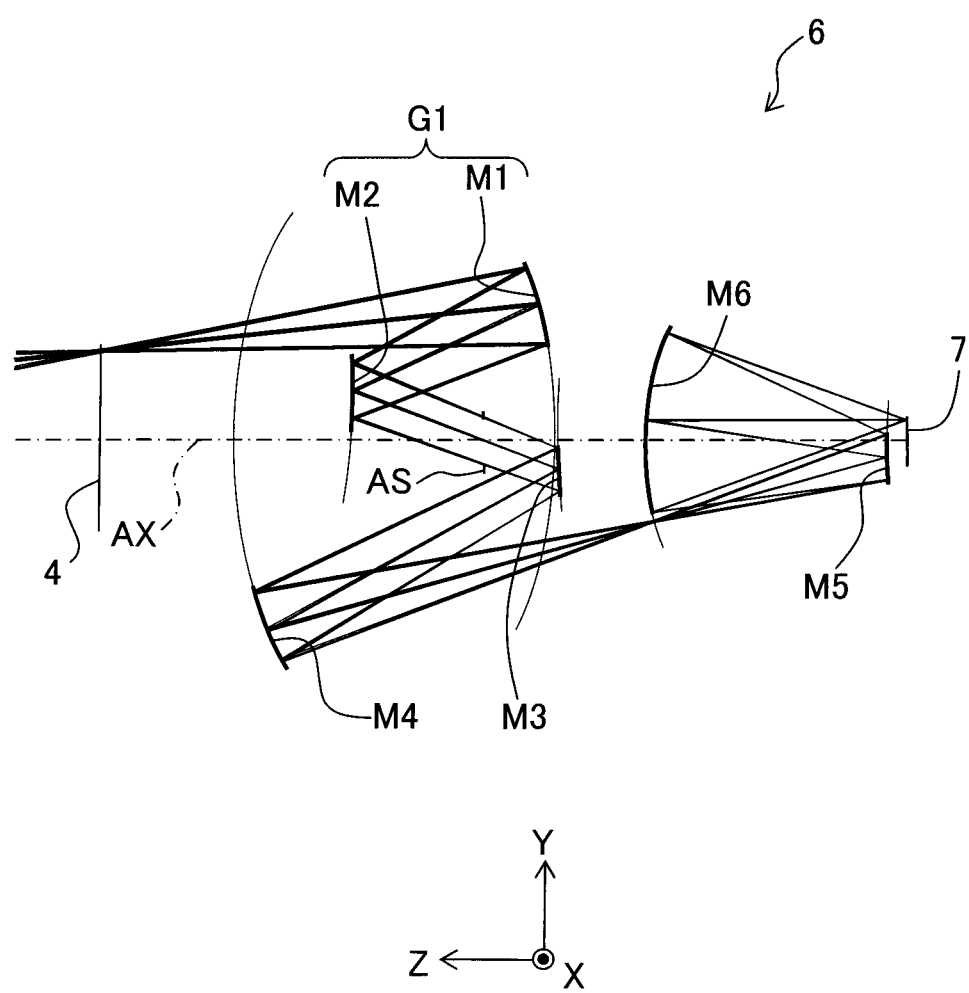
FIG. 7 schematically shows a construction of a reflective imaging optical system according to a fourth embodiment.

FIG. 7 shows a construction of a reflective imaging optical system according to a fourth embodiment of the embodiment of the present invention. With reference to FIG. 7, the light from the mask 4 is also successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed in the fourth embodiment in the same manner as in the first to third embodiments. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 4 described below shows values of items or elements of the reflective imaging optical system according to the fourth embodiment.

TABLE 4

Major Items:

$\lambda$ = 13.5 nm
$\beta$ = ¼

TABLE 4-continued

NA = 0.35
Y0 = 56.05 mm
LX = 26 mm
LY = 1.5 mm

Optical Member Items:

| Surface No. | r | d | Optical member |
|---|---|---|---|
|  | (mask surface) | 1135.58 |  |
| 1 | −1243.69 | −500.02 | (first reflecting mirror M1) |
| 2 | −3183.34 | 324.77 | (second reflecting mirror M2) |
|  |  | 178.12 | (aperture stop AS) |
| 3 | 893.04 | −803.06 | (third reflecting mirror M3) |
| 4 | 1212.24 | 1611.20 | (fourth reflecting mirror M4) |
| 5 | 624.42 | −592.24 | (fifth reflecting mirror M5) |
| 6 | 712.17 | 645.65 | (sixth reflecting mirror M6) |
|  | (wafer surface) |  |  |

Aspherical Data:

First Surface:

$\kappa = 0$
$C_4 = 2.018 \times 10^{-11}$      $C_6 = 5.131 \times 10^{-17}$
$C_8 = -2.142 \times 10^{-22}$     $C_{10} = 1.649 \times 10^{-27}$
$C_{12} = -5.805 \times 10^{-33}$  $C_{14} = 1.079 \times 10^{-38}$
$C_{16} = -7.862 \times 10^{-45}$  $C_{18} = 0$ Second Surface:

$\kappa = 0$
$C_4 = 5.757 \times 10^{-10}$      $C_6 = -3.614 \times 10^{-16}$
$C_8 = -1.201 \times 10^{-21}$     $C_{10} = 6.013 \times 10^{-26}$
$C_{12} = -3.460 \times 10^{-30}$  $C_{14} = 6.084 \times 10^{-35}$
$C_{16} = -3.669 \times 10^{-40}$  $C_{18} = 0$ Third Surface:

$\kappa = 0$
$C_4 = -4.451 \times 10^{-9}$      $C_6 = 5.233 \times 10^{-14}$
$C_8 = -7.762 \times 10^{-19}$     $C_{10} = 7.419 \times 10^{-24}$
$C_{12} = 1.076 \times 10^{-28}$   $C_{14} = -5.803 \times 10^{-33}$
$C_{16} = 7.036 \times 10^{-38}$   $C_{18} = 0$ Fourth Surface:

$\kappa = 0$
$C_4 = -7.325 \times 10^{-12}$     $C_6 = 5.711 \times 10^{-18}$
$C_8 = -1.018 \times 10^{-22}$     $C_{10} = 4.406 \times 10^{-28}$
$C_{12} = -1.223 \times 10^{-33}$  $C_{14} = 1.848 \times 10^{-39}$
$C_{16} = -1.220 \times 10^{-45}$  $C_{18} = 0$ Fifth Surface:

$\kappa = 0$
$C_4 = 3.972 \times 10^{-9}$       $C_6 = 4.110 \times 10^{-14}$
$C_8 = 4.748 \times 10^{-19}$      $C_{10} = 1.538 \times 10^{-23}$
$C_{12} = -2.604 \times 10^{-27}$  $C_{14} = 2.280 \times 10^{-31}$
$C_{16} = -6.850 \times 10^{-36}$  $C_{18} = 0$ Sixth Surface:

$\kappa = 0$
$C_4 = 1.181 \times 10^{-11}$      $C_6 = 5.359 \times 10^{-17}$
$C_8 = 1.004 \times 10^{-22}$      $C_{10} = 8.704 \times 10^{-29}$
$C_{12} = 3.351 \times 10^{-33}$   $C_{14} = -2.739 \times 10^{-38}$
$C_{16} = 1.064 \times 10^{-43}$   $C_{18} = 0$ Values Corresponding to Conditional Expression:

PD = 2100 mm
TT = 2000 mm
R = −0.105 rad
(1) (PD/TT)/R = −10.0

In relation to the reflective imaging optical system of the fourth embodiment, the maximum value (worst value) of RMS of the wavefront aberration was 0.0334λ (λ: wavelength of light=13.5 nm). In the fourth embodiment, the ratio PD/TT of the incident pupil distance PD with respect to the total length TT of the reflective imaging optical system is larger than that of the first embodiment. As a result, the maximum value of RMS of the wavefront aberration is smaller than that of the first embodiment. That is, also in the fourth embodiment, it is possible to secure the relatively large numerical aperture on the image side of 0.35, and it is possible to secure the circular arc-shaped effective imaging area of 26 mm×1.5 mm in which the various aberrations are satisfactorily corrected on the wafer 7.

Fifth Embodiment

Figure 8:
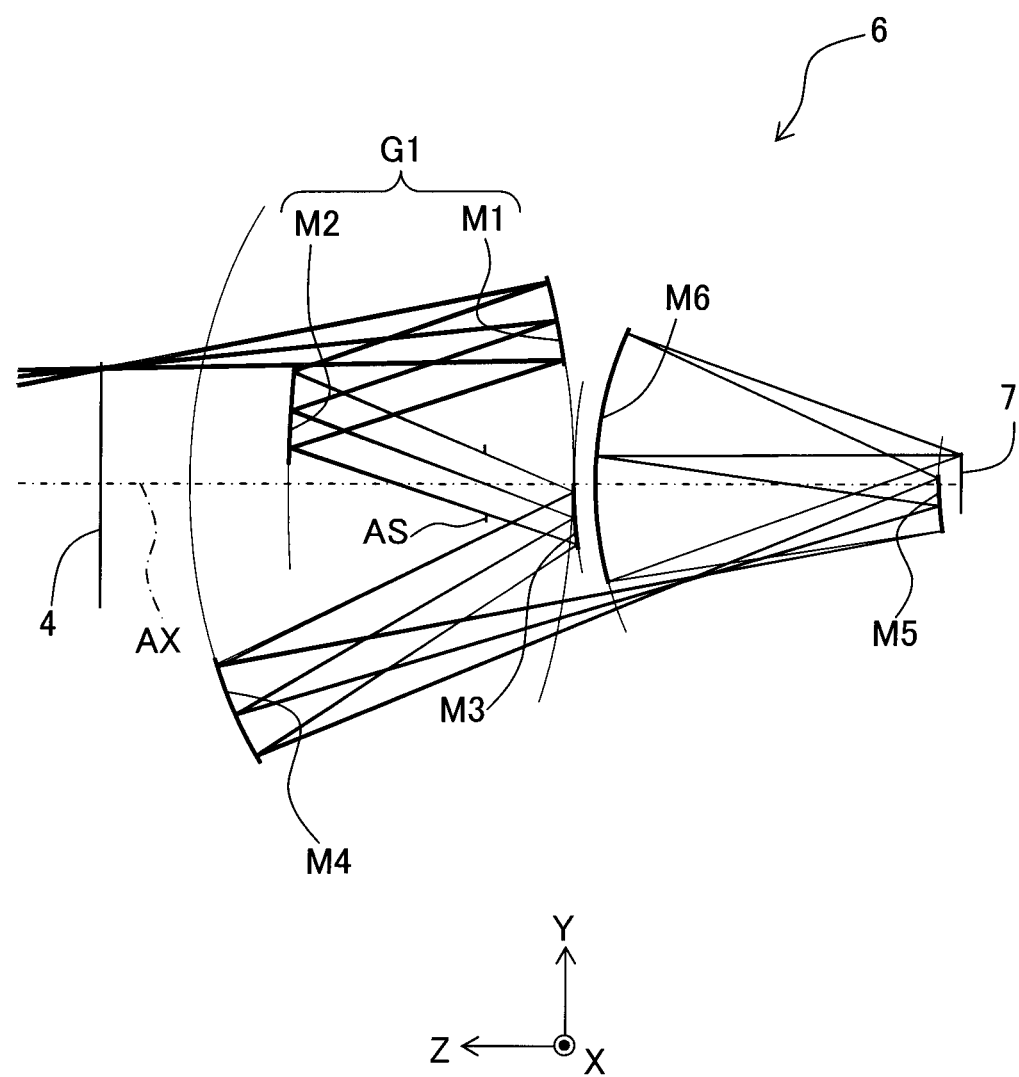
FIG. 8 schematically shows a construction of a reflective imaging optical system according to a fifth embodiment.

FIG. 8 shows a construction of a reflective imaging optical system according to a fifth embodiment of the embodiment of the present invention. With reference to FIG. 8, the light from the mask 4 is successively reflected by the concave reflecting surface of the first reflecting mirror M1, the concave reflecting surface of the second reflecting mirror M2, the convex reflecting surface of the third reflecting mirror M3, and the concave reflecting surface of the fourth reflecting mirror M4, and then the intermediate image of the mask pattern is formed in the fifth embodiment unlike the first to fourth embodiments. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 5 described below shows values of items or elements of the reflective imaging optical system according to the fifth embodiment.

TABLE 5

Major Items:

λ = 13.5 nm
β = ¼
NA = 0.35
Y0 = 69.25 mm
LX = 26 mm
LY = 1.0 mm

Optical Member Items:

| Surface No. | r | d | Optical member |
|---|---|---|---|
|  | (mask surface) | 1098.83 |  |
| 1 | −1752.42 | −663.44 | (first reflecting mirror M1) |
| 2 | 10802.64 | 456.22 | (second reflecting mirror M2) |
|  |  | 205.26 | (aperture stop AS) |
| 3 | 929.52 | −896.87 | (third reflecting mirror M3) |
| 4 | 1344.38 | 1747.51 | (fourth reflecting mirror M4) |
| 5 | 708.72 | −798.68 | (fifth reflecting mirror M5) |
| 6 | 926.73 | 851.17 | (sixth reflecting mirror M6) |
|  | (wafer surface) |  |  |

Aspherical Data:

First Surface:

$\kappa = 0$
$C_4 = 1.507 \times 10^{-11}$      $C_6 = 8.475 \times 10^{-17}$
$C_8 = -5.421 \times 10^{-22}$     $C_{10} = 2.988 \times 10^{-27}$
$C_{12} = -9.014 \times 10^{-33}$  $C_{14} = 1.448 \times 10^{-38}$
$C_{16} = -9.335 \times 10^{-45}$  $C_{18} = 0$ Second Surface:

$\kappa = 0$
$C_4 = 2.048 \times 10^{-10}$      $C_6 = -6.917 \times 10^{-17}$
$C_8 = 1.157 \times 10^{-21}$      $C_{10} = -1.540 \times 10^{-26}$
$C_{12} = 4.827 \times 10^{-32}$   $C_{14} = 3.429 \times 10^{-37}$
$C_{16} = -1.979 \times 10^{-42}$  $C_{18} = 0$

TABLE 5-continued

Third Surface:

$\kappa = 0$
$C_4 = -2.999 \times 10^{-9}$     $C_6 = 2.780 \times 10^{-14}$
$C_8 = -3.913 \times 10^{-19}$     $C_{10} = 7.336 \times 10^{-24}$
$C_{12} = -1.603 \times 10^{-28}$     $C_{14} = 2.684 \times 10^{-33}$
$C_{16} = -2.189 \times 10^{-38}$     $C_{18} = 0$

Fourth Surface:

$\kappa = 0$
$C_4 = -7.915 \times 10^{-12}$     $C_6 = 1.991 \times 10^{-17}$
$C_8 = -1.112 \times 10^{-22}$     $C_{10} = 3.179 \times 10^{-28}$
$C_{12} = -5.852 \times 10^{-34}$     $C_{14} = 6.062 \times 10^{-40}$
$C_{16} = -2.760 \times 10^{-46}$     $C_{18} = 0$

Fifth Surface:

$\kappa = 0$
$C_4 = 2.710 \times 10^{-9}$     $C_6 = 2.033 \times 10^{-14}$
$C_8 = 1.989 \times 10^{-19}$     $C_{10} = 2.165 \times 10^{-24}$
$C_{12} = -2.947 \times 10^{-28}$     $C_{14} = 2.101 \times 10^{-32}$
$C_{16} = -4.112 \times 10^{-37}$     $C_{18} = 0$

Sixth Surface:

$\kappa = 0$
$C_4 = 3.526 \times 10^{-12}$     $C_6 = 1.149 \times 10^{-17}$
$C_8 = 1.201 \times 10^{-23}$     $C_{10} = 1.233 \times 10^{-29}$
$C_{12} = 5.574 \times 10^{-35}$     $C_{14} = -1.400 \times 10^{-40}$
$C_{16} = 2.916 \times 10^{-46}$     $C_{18} = 0$

Values Corresponding to Conditional Expression:

PD = 2600 mm
TT = 2000 mm
R = −0.105 rad
(1) (PD/TT)/R = −12.4

In relation to the reflective imaging optical system of the fifth embodiment, the maximum value (worst value) of RMS of the wavefront aberration was $0.0372\lambda$ ($\lambda$: wavelength of light=13.5 nm). In the fifth embodiment, the ratio PD/TT of the incident pupil distance PD with respect to the total length TT of the reflective imaging optical system is larger than that of the fourth embodiment. Therefore, the maximum value of RMS of the wavefront aberration is suppressed to be relatively small. Further, it is expected that the overlay error of the illumination fields can be suppressed to be small in the illumination optical system to be combined with the reflective imaging optical system of this embodiment. In the fifth embodiment, it is possible to secure the relatively large numerical aperture on the image side of 0.35, and it is possible to secure the circular arc-shaped effective imaging area of 26 mm×1.0 mm in which the various aberrations are satisfactorily corrected on the wafer 7.

Sixth Embodiment

Figure 9:
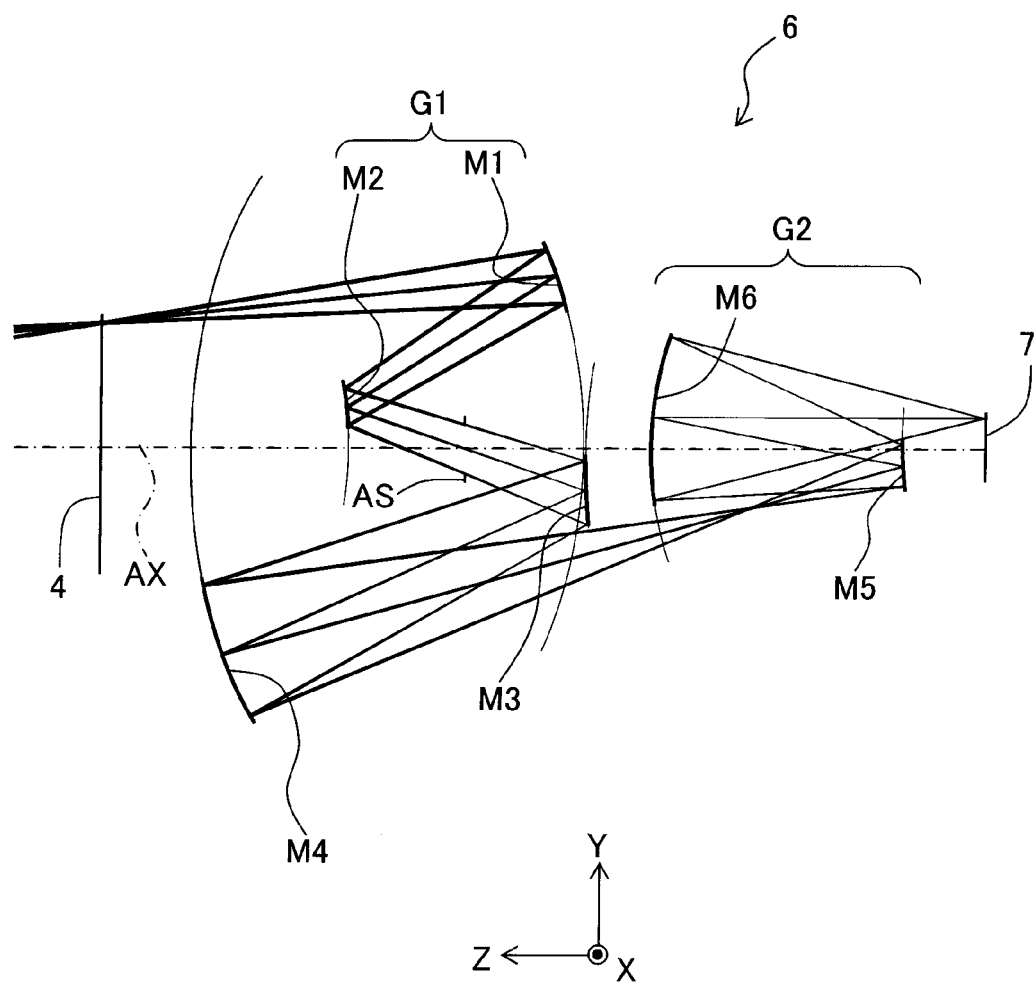
FIG. 9 schematically shows a construction of a reflective imaging optical system according to a sixth embodiment.

FIG. 9 shows a construction of a reflective imaging optical system according to a sixth embodiment of the embodiment of the present invention. With reference to FIG. 9, the light from the mask 4 is successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed in the sixth embodiment in the same manner as in the first to fourth embodiments. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 6 described below shows values of items or elements of the reflective imaging optical system according to the sixth embodiment.

TABLE 6

Major Items:

$\lambda = 13.5$ nm
$\beta = 1/4$
NA = 0.25
Y0 = 72.95 mm
LX = 26 mm
LY = 1.0 mm

Optical Member Items:

| Surface No. | r | d | Optical member |
|---|---|---|---|
|  | (mask surface) | 1094.01 |  |
| 1 | −1192.72 | −532.85 | (first reflecting mirror M1) |
| 2 | −822.44 | 261.92 | (second reflecting mirror M2) |
|  |  | 270.93 | (aperture stop AS) |
| 3 | 2104.12 | −894.01 | (third reflecting mirror M3) |
| 4 | 1354.13 | 1612.89 | (fourth reflecting mirror M4) |
| 5 | 873.11 | −568.88 | (fifth reflecting mirror M5) |
| 6 | 763.20 (wafer surface) | 755.99 | (sixth reflecting mirror M6) |

Aspherical Data:

First Surface:

$\kappa = 0$
$C_4 = 1.064 \times 10^{-11}$     $C_6 = -5.785 \times 10^{-18}$
$C_8 = -3.276 \times 10^{-22}$     $C_{10} = 3.166 \times 10^{-27}$
$C_{12} = -1.299 \times 10^{-32}$     $C_{14} = 2.562 \times 10^{-38}$
$C_{16} = -1.993 \times 10^{-44}$     $C_{18} = 0$

Second Surface:

$\kappa = 0$
$C_4 = 2.983 \times 10^{-10}$     $C_6 = -2.391 \times 10^{-15}$
$C_8 = 5.710 \times 10^{-19}$     $C_{10} = -3.803 \times 10^{-23}$
$C_{12} = 1.374 \times 10^{-27}$     $C_{14} = -2.780 \times 10^{-32}$
$C_{16} = 2.510 \times 10^{-37}$     $C_{18} = 0$

Third Surface:

$\kappa = 0$
$C_4 = -1.000 \times 10^{-9}$     $C_6 = 5.260 \times 10^{-15}$
$C_8 = -4.399 \times 10^{-20}$     $C_{10} = 8.230 \times 10^{-25}$
$C_{12} = -1.863 \times 10^{-29}$     $C_{14} = 2.658 \times 10^{-34}$
$C_{16} = -1.749 \times 10^{-39}$     $C_{18} = 0$

Fourth Surface:

$\kappa = 0$
$C_4 = -3.272 \times 10^{-12}$     $C_6 = -1.881 \times 10^{-18}$
$C_8 = -5.843 \times 10^{-24}$     $C_{10} = 1.511 \times 10^{-29}$
$C_{12} = -4.191 \times 10^{-35}$     $C_{14} = 6.330 \times 10^{-41}$
$C_{16} = -4.310 \times 10^{-47}$     $C_{18} = 0$

Fifth Surface:

$\kappa = 0$
$C_4 = 1.343 \times 10^{-9}$     $C_6 = 9.807 \times 10^{-15}$
$C_8 = 9.613 \times 10^{-19}$     $C_{10} = -2.386 \times 10^{-22}$
$C_{12} = 3.158 \times 10^{-26}$     $C_{14} = -2.293 \times 10^{-30}$
$C_{16} = 7.149 \times 10^{-35}$     $C_{18} = 0$

Sixth Surface:

$\kappa = 0$
$C_4 = 3.707 \times 10^{-12}$     $C_6 = 3.103 \times 10^{-17}$
$C_8 = 4.957 \times 10^{-23}$     $C_{10} = 1.893 \times 10^{-28}$
$C_{12} = -9.880 \times 10^{-34}$     $C_{14} = 6.288 \times 10^{-39}$
$C_{16} = -2.232 \times 10^{-44}$     $C_{18} = 0$

Values Corresponding to Conditional Expression:

PD = 2750 mm
TT = 2000 mm

TABLE 6-continued

R = −0.105 rad
(1) (PD/TT)/R = −13.1

In relation to the reflective imaging optical system of the sixth embodiment, the maximum value (worst value) of RMS of the wavefront aberration was 0.0334λ (λ: wavelength of light=13.5 nm). In the sixth embodiment, the ratio PD/TT of the incident pupil distance PD with respect to the total length TT of the reflective imaging optical system is larger than that of the fifth embodiment. Therefore, the maximum value of RMS of the wavefront aberration is suppressed to be small as compared with the fifth embodiment. Further, it is expected that the overlay error of the illumination fields can be suppressed to be small in the illumination optical system to be combined with the reflective imaging optical system of this embodiment. In the sixth embodiment, it is possible to secure the relatively large numerical aperture on the image side of 0.25, and it is possible to secure the circular arc-shaped effective imaging area of 26 mm×1.0 mm in which the various aberrations are satisfactorily corrected on the wafer 7.

Seventh Embodiment

Figure 10:
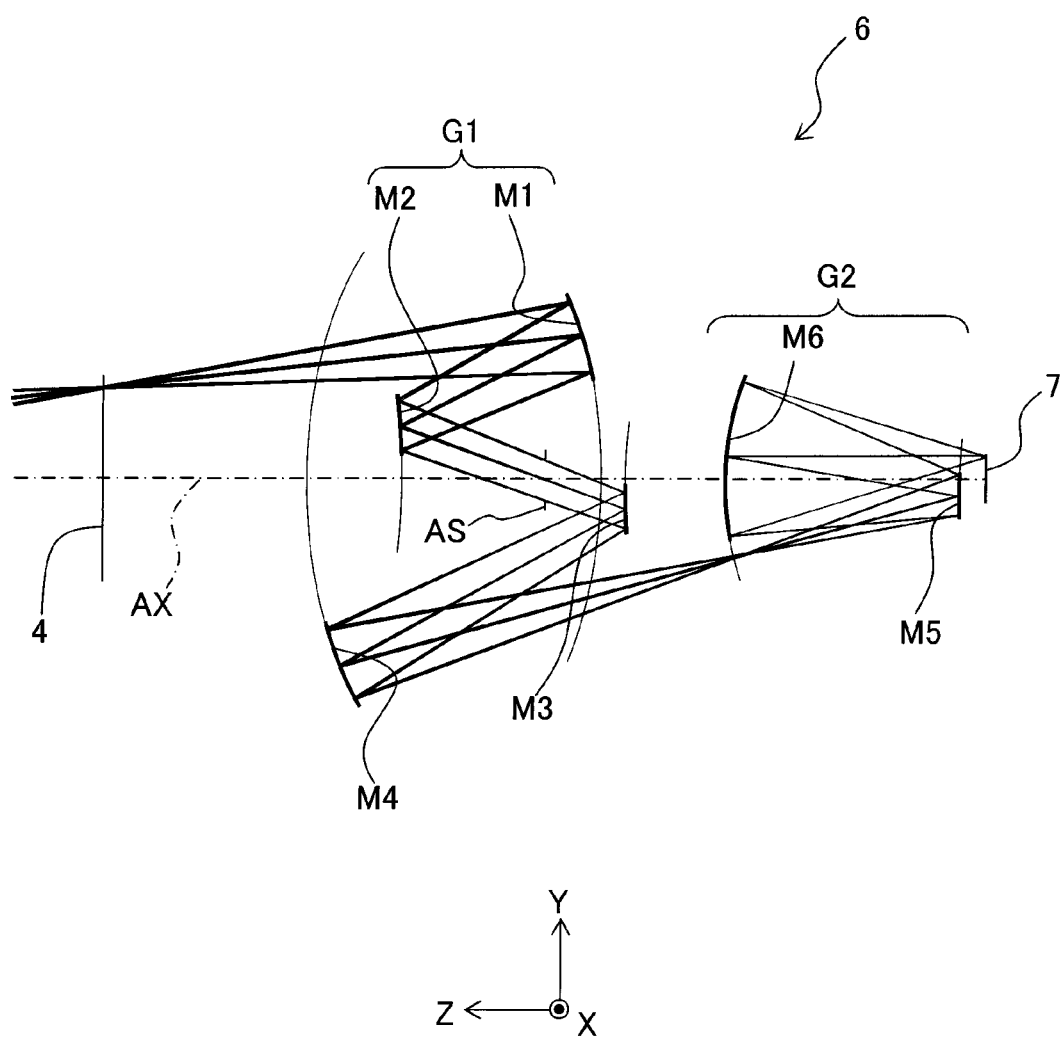
FIG. 10 schematically shows a construction of a reflective imaging optical system according to a seventh embodiment.

FIG. 10 shows a construction of a reflective imaging optical system according to a seventh embodiment of the embodiment of the present invention. With reference to FIG. 10, the light from the mask 4 is successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed in the seventh embodiment in the same manner as in the first to fourth embodiments and the sixth embodiment. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 7 described below shows values of items or elements of the reflective imaging optical system according to the seventh embodiment.

TABLE 7

Major Items:

$\lambda$ = 13.5 nm
$\beta$ = ¼
NA = 0.3
Y0 = 53.7 mm
LX = 26 mm
LY = 2.0 mm

Optical Member Items:

| Surface No. | r | d | Optical member |
|---|---|---|---|
| | (mask surface) | 1133.91 | |
| 1 | −1150.90 | −454.28 | (first reflecting mirror M1) |
| 2 | −2170.88 | 325.50 | (second reflecting mirror M2) |
| | | 179.26 | (aperture stop AS) |
| 3 | 824.38 | −722.48 | (third reflecting mirror M3) |
| 4 | 1105.46 | 1475.26 | (fourth reflecting mirror M4) |
| 5 | 604.97 | −527.74 | (fifth reflecting mirror M5) |
| 6 | 647.49 | 590.57 | (sixth reflecting mirror M6) |
| | (wafer surface) | | |

TABLE 7-continued

Aspherical Data:

First Surface:

$\kappa = 0$
$C_4 = 2.704 \times 10^{-11}$    $C_6 = 5.826 \times 10^{-17}$
$C_8 = -1.898 \times 10^{-22}$    $C_{10} = 1.439 \times 10^{-27}$
$C_{12} = -4.299 \times 10^{-33}$    $C_{14} = 5.447 \times 10^{-39}$
$C_{16} = 2.029 \times 10^{-46}$    $C_{18} = 0$ Second Surface:

$\kappa = 0$
$C_4 = 7.684 \times 10^{-10}$    $C_6 = -1.283 \times 10^{-15}$
$C_8 = 3.379 \times 10^{-22}$    $C_{10} = 1.977 \times 10^{-25}$
$C_{12} = -7.113 \times 10^{-30}$    $C_{14} = 1.056 \times 10^{-34}$
$C_{16} = -5.741 \times 10^{-40}$    $C_{18} = 0$ Third Surface:

$\kappa = 0$
$C_4 = -4.962 \times 10^{-9}$    $C_6 = 6.192 \times 10^{-14}$
$C_8 = -1.013 \times 10^{-18}$    $C_{10} = 1.252 \times 10^{-23}$
$C_{12} = 1.112 \times 10^{-28}$    $C_{14} = -1.074 \times 10^{-32}$
$C_{16} = 1.805 \times 10^{-37}$    $C_{18} = 0$ Fourth Surface:

$\kappa = 0$
$C_4 = -1.030 \times 10^{-11}$    $C_6 = 8.593 \times 10^{-18}$
$C_8 = -1.606 \times 10^{-22}$    $C_{10} = 7.438 \times 10^{-28}$
$C_{12} = -2.303 \times 10^{-33}$    $C_{14} = 3.915 \times 10^{-39}$
$C_{16} = -2.926 \times 10^{-45}$    $C_{18} = 0$ Fifth Surface:

$\kappa = 0$
$C_4 = 4.753 \times 10^{-9}$    $C_6 = 4.954 \times 10^{-14}$
$C_8 = 5.520 \times 10^{-19}$    $C_{10} = 3.861 \times 10^{-23}$
$C_{12} = -5.321 \times 10^{-27}$    $C_{14} = 4.293 \times 10^{-31}$
$C_{16} = -1.167 \times 10^{-35}$    $C_{18} = 0$ Sixth Surface:

$\kappa = 0$
$C_4 = 1.660 \times 10^{-11}$    $C_6 = 9.124 \times 10^{-17}$
$C_8 = 1.991 \times 10^{-22}$    $C_{10} = 6.909 \times 10^{-28}$
$C_{12} = -7.987 \times 10^{-34}$    $C_{14} = 2.539 \times 10^{-38}$
$C_{16} = -1.028 \times 10^{-43}$    $C_{18} = 0$ Values Corresponding to Conditional Expression:

PD = 2000 mm
TT = 2000 mm
R = −0.105 rad
(1) (PD/TT)/R = −9.5

In relation to the reflective imaging optical system of the seventh embodiment, the maximum value (worst value) of RMS of the wavefront aberration was 0.0163λ (λ: wavelength of light=13.5 nm). In the seventh embodiment, the maximum value of RMS of the wavefront aberration is suppressed to be extremely small. It is possible to secure the relatively large numerical aperture on the image side of 0.3, and it is possible to secure the circular arc-shaped effective imaging area of 26 mm×2.0 mm in which the various aberrations are satisfactorily corrected on the wafer 7.

Eighth Embodiment

Figure 11:
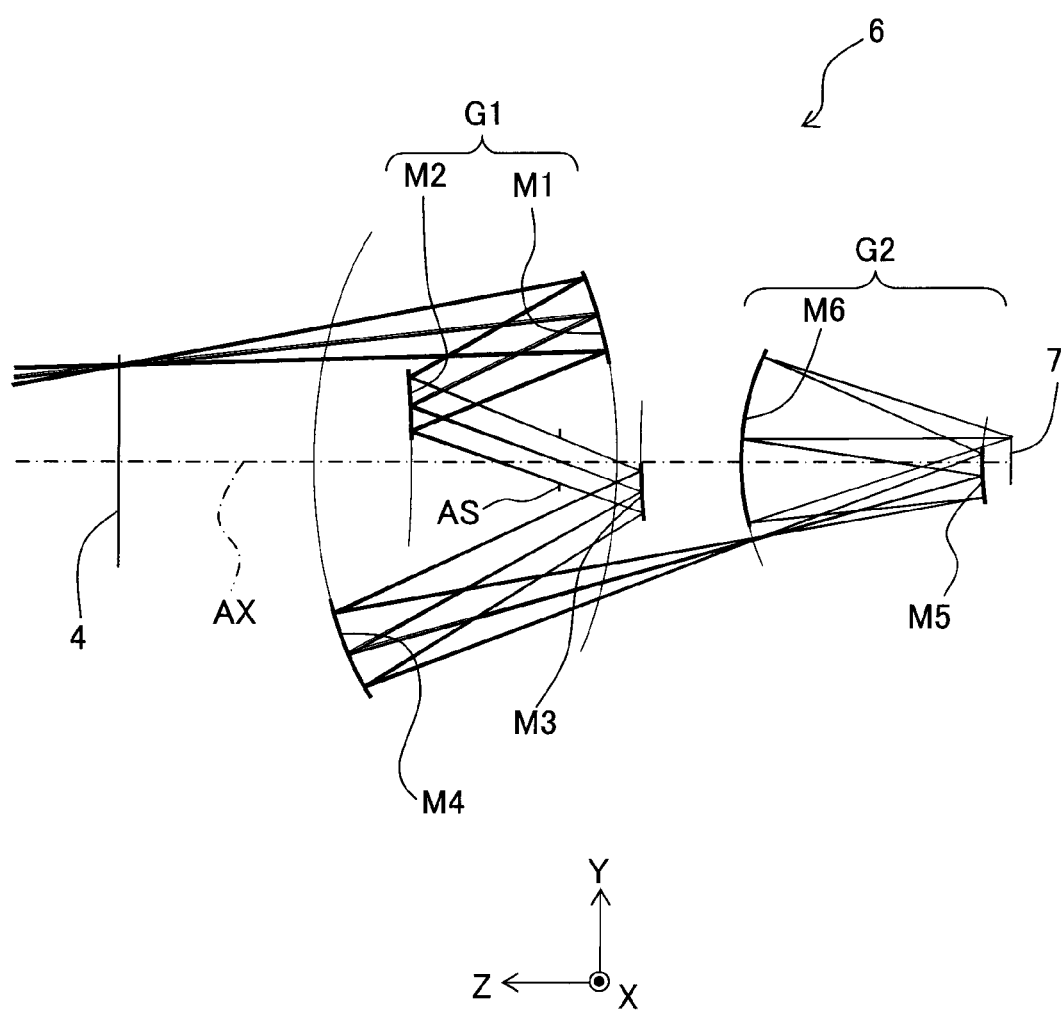
FIG. 11 schematically shows a construction of a reflective imaging optical system according to an eighth embodiment.

FIG. 11 shows a construction of a reflective imaging optical system according to an eighth embodiment of the embodiment of the present invention. With reference to FIG. 11, the light from the mask 4 is successively reflected by the concave reflecting surface of the first reflecting mirror M1, the convex reflecting surface of the second reflecting mirror M2, the convex reflecting surface of the third reflecting mirror M3, and the concave reflecting surface of the fourth reflecting mirror M4, and then the intermediate image of the mask pattern is formed in the eighth embodiment in the same manner as in the first to fourth embodiments and the sixth and seventh embodiments. The light from the intermediate image formed via the first reflective optical system G1 is successively reflected by the convex reflecting surface of the fifth reflecting mirror M5 and the concave reflecting surface of the sixth reflecting mirror M6, and then the reduced image of the mask pattern is formed on the wafer 7. Table 8 described below shows values of items or elements of the reflective imaging optical system according to the eighth embodiment.

TABLE 8

Major Items:

$\lambda = 13.5$ nm
$\beta = \frac{1}{4}$
NA = 0.32
Y0 = 53.7 mm
LX = 26 mm
LY = 2.0 mm Optical Member Items:

| Surface No. | r | d | Optical member |
|---|---|---|---|
|  | (mask surface) | 1133.51 |  |
| 1 | −1151.01 | −454.18 | (first reflecting mirror M1) |
| 2 | −2167.68 | 326.21 | (second reflecting mirror M2) |
|  |  | 179.09 | (aperture stop AS) |
| 3 | 822.43 | −722.50 | (third reflecting mirror M3) |
| 4 | 1105.47 | 1475.36 | (fourth reflecting mirror M4) |
| 5 | 606.28 | −527.82 | (fifth reflecting mirror M5) |
| 6 | 647.37 | 590.32 | (sixth reflecting mirror M6) |
|  | (wafer surface) |  |  |

Aspherical Data:

First Surface:

$\kappa = 0$
$C_4 = 2.694 \times 10^{-11}$   $C_6 = 5.881 \times 10^{-17}$
$C_8 = -1.930 \times 10^{-22}$   $C_{10} = 1.445 \times 10^{-27}$
$C_{12} = -4.210 \times 10^{-33}$   $C_{14} = 4.899 \times 10^{-39}$
$C_{16} = 1.130 \times 10^{-45}$   $C_{18} = 0$ Second Surface:

$\kappa = 0$
$C_4 = 7.645 \times 10^{-10}$   $C_6 = -1.203 \times 10^{-15}$
$C_8 = -1.781 \times 10^{-21}$   $C_{10} = 2.735 \times 10^{-25}$
$C_{12} = -8.976 \times 10^{-30}$   $C_{14} = 1.306 \times 10^{-34}$
$C_{16} = -7.141 \times 10^{-40}$   $C_{18} = 0$ Third Surface:

$\kappa = 0$
$C_4 = -4.995 \times 10^{-9}$   $C_6 = 6.258 \times 10^{-14}$
$C_8 = -1.029 \times 10^{-18}$   $C_{10} = 1.288 \times 10^{-23}$
$C_{12} = 1.121 \times 10^{-28}$   $C_{14} = -1.125 \times 10^{-32}$
$C_{16} = 1.939 \times 10^{-37}$   $C_{18} = 0$ Fourth Surface:

$\kappa = 0$
$C_4 = -1.030 \times 10^{-11}$   $C_6 = 8.370 \times 10^{-18}$
$C_8 = -1.600 \times 10^{-22}$   $C_{10} = 7.453 \times 10^{-28}$
$C_{12} = -2.319 \times 10^{-33}$   $C_{14} = 3.958 \times 10^{-39}$
$C_{16} = -2.966 \times 10^{-45}$   $C_{18} = 0$ Fifth Surface:

$\kappa = 0$
$C_4 = 4.735 \times 10^{-9}$   $C_6 = 4.964 \times 10^{-14}$
$C_8 = 5.186 \times 10^{-19}$   $C_{10} = 5.064 \times 10^{-23}$
$C_{12} = -7.501 \times 10^{-27}$   $C_{14} = 6.259 \times 10^{-31}$
$C_{16} = -1.910 \times 10^{-35}$   $C_{18} = 0$ Sixth Surface:

$\kappa = 0$
$C_4 = 1.634 \times 10^{-11}$   $C_6 = 9.119 \times 10^{-17}$
$C_8 = 1.972 \times 10^{-22}$   $C_{10} = 7.150 \times 10^{-28}$

TABLE 8-continued $C_{12} = -1.297 \times 10^{-33}$   $C_{14} = 3.022 \times 10^{-38}$
$C_{16} = -1.166 \times 10^{-43}$   $C_{18} = 0$ Values Corresponding to Conditional Expression:

PD = 2000 mm
TT = 2000 mm
R = −0.105 rad
(1) (PD/TT)/R = −9.5

In relation to the reflective imaging optical system of the eighth embodiment, the maximum value (worst value) of RMS of the wavefront aberration was 0.0305λ (λ: wavelength of light=13.5 nm). In the eighth embodiment, the maximum value of RMS of the wavefront aberration is suppressed to be small. It is possible to secure the relatively large numerical aperture on the image side of 0.32, and it is possible to secure the circular arc-shaped effective imaging area of 26 mm×2.0 mm in which the various aberrations are satisfactorily corrected on the wafer 7.

In the respective specified embodiments described above, it is possible to secure the satisfactory imaging performance and the relatively large numerical aperture on the image side of 0.25 to 0.35, and it is possible to secure the circular arc-shaped effective imaging area of 26 mm×1 mm to 2 mm in which the various aberrations are satisfactorily corrected on the wafer 7, with respect to the EUV light having the wavelength of 13.5 nm. Therefore, the pattern of the mask 4 can be transferred at the high resolution of not more than 0.1 μm by the scanning exposure to each of the exposure areas having the size of, for example, 26 mm×34 mm or 26 mm×37 mm on the wafer 7.

In the respective specified embodiments described above, the EUV light having the wavelength of 13.5 nm is used by way of example. However, there is no limitation to this. The present invention is also applicable similarly or equivalently to a reflective imaging optical system which uses, for example, the EUV light having a wavelength of about 5 to 40 nm or any other light having an appropriate wavelength.

The respective specified embodiments described above have such common features that the total length TT is 2000 mm, the angle of incidence R is −0.105 rad, the magnitude of the imaging magnification β is ¼, and the number of the reflecting mirrors is six. However, the respective specified embodiments described above are examples of the embodiment which can be carried out within the scope of the present invention. It goes without saying that the total length TT, the angle of incidence R, the imaging magnification β, the number of the reflecting mirrors, etc. are not limited to the numerical values referred to in the respective specified embodiments.

In the respective specified embodiments described above, the reflective imaging optical system 6 includes the six reflecting mirrors M1 to M6 wherein the centers of curvature of the reflecting surfaces are arranged on the same axis (on the optical axis AX). However, at least one of the six reflecting mirrors M1 to M6 may be provided such that the center of curvature of the reflecting surface is deviated or shifted from the optical axis AX. In the respective specified embodiments described above, all of the reflecting mirrors M1 to M6 have the reflecting surfaces which are formed along the surfaces rotationally symmetrical an infinite number of times in relation to the optical axis AX. However, at least one of the reflecting mirrors M1 to M6 may have a reflecting surface which is formed along a surface rotationally symmetrical a finite number of times (for example, once, twice, three times).

The exposure apparatus of the embodiment described above is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. The exposure apparatus may be produced in a clean room in which the temperature, the cleanness, etc. are managed.

Next, an explanation will be made about a device production method using the exposure apparatus according to the embodiment described above. FIG. 12 shows a flow chart illustrating steps of producing a semiconductor device. As shown in FIG. 12, in the steps of producing the semiconductor device, a metal film is vapor-deposited on a wafer W which is to serve as a substrate of the semiconductor device (Step S40); and a photoresist as a photosensitive material is coated on the vapor-deposited metal film (Step S42). Subsequently, a pattern formed on a mask (reticle) M is transferred to each of shot areas on the wafer W by using the exposure apparatus of the embodiment described above (Step S44: exposure step). The wafer W for which the transfer has been completed is developed, i.e., the photoresist, to which the pattern has been transferred, is developed (Step S46: development step). After that, the resist pattern, which is formed on the surface of the wafer W in accordance with Step S46, is used as a mask to perform the processing including, for example, the etching with respect to the surface of the wafer W (Step S48: processing step).

The resist pattern herein refers to the photoresist layer formed with protrusions and recesses having shapes corresponding to the pattern transferred by the exposure apparatus of the embodiment described above, wherein the recesses penetrate through the photoresist layer. In Step S48, the surface of the wafer W is processed via the resist pattern. The processing, which is performed in Step S48, includes, for example, at least one of the etching of the surface of the wafer W and the film formation of a metal film or the like. In Step S44, the exposure apparatus of the embodiment described above transfers the pattern by using, as the photosensitive substrate, the wafer W coated with the photoresist.

In the embodiment described above, the laser plasma X-ray light source is used as the light source for supplying the EUV light. However, there is no limitation to this. It is also possible to use, for example, the synchrotron radiation (SOR) light as the EUV light.

In the embodiment described above, the present invention is applied to the exposure apparatus having the light source for supplying the EUV light. However, there is no limitation to this. The present invention is also applicable to an exposure apparatus having a light source for supplying a light having any wavelength other than the EUV light.

In the embodiment described above, it is possible to use a variable pattern-forming apparatus for dynamically forming a predetermined pattern based on predetermined electronic data, instead of using the mask M. It is possible to use, as such a variable pattern-forming apparatus, for example, DMD (digital micromirror device) including a plurality of reflecting elements which are driven based on predetermined electronic data. The exposure apparatus, which uses DMD, is disclosed, for example, in United States Patent Application Publication Nos. 2007/0296936 and 2009/0122381.

In the embodiment described above, the present invention is applied to the reflective imaging optical system of the far pupil type provided as the projection optical system of the exposure apparatus. However, there is no limitation to this. In general, the present invention is also applicable similarly or equivalently to any reflective imaging optical system of the near pupil type in which an image of a first plane is formed on a second plane.

What is claimed is:

1. An exposure optical system comprising:
an illumination optical system configured to illuminate a pattern arranged on a first plane with a light from a light source; and
a reflective imaging optical system configured to project an image of the pattern onto a photosensitive substrate arranged on a second plane,
wherein the reflective imaging optical system includes an incident pupil positioned on a side opposite to the reflective imaging optical system such that:
the first plane is located between the incident pupil and the reflective imaging optical system; and
a condition of $-14.3<(PD/TT)/R \leftarrow 8.3$ is fulfilled, where PD represents a distance along an optical axis between the incident pupil and the first plane, TT represents a distance along the optical axis between the first-plane and the second plane, and R represents an angle of incidence (rad) of a main light beam incident on the first plane:
and
wherein the illumination optical system includes a plurality of first reflecting optical elements arranged in parallel and positioned on the incident pupil, and the illumination optical system superimposes a plurality of light beams on the first plane, the plurality of light beams being generated by reflection of the light by the first reflecting optical elements.

2. The exposure optical system according to claim 1, wherein a condition of $-13.7<(PD/TT)/R \leftarrow 8.3$ is fulfilled.

3. The exposure optical system according to claim 1, wherein a condition of $-14.3<(PD/TT)/R \leftarrow 8.6$ is fulfilled.

4. The exposure optical system according to claim 1, wherein a condition of $-13.7<(PD/TT)/R \leftarrow 8.6$ is fulfilled.

5. The exposure optical system according to claim 1, wherein the reflective imaging optical system comprises a plurality of reflecting mirrors, at least a portion of the mirrors having reflecting surfaces with centers of curvature arranged on an identical axis.

6. The exposure optical system according to claim 5, wherein the reflecting surfaces are formed along rotationally symmetric surfaces in relation to the axis.

7. The exposure optical system according to claim 1, wherein the reflective imaging optical system comprises a plurality of reflecting mirrors, all of the plurality of reflecting mirrors having reflecting surfaces with centers of curvature arranged on an identical axis.

8. The exposure optical system according to claim 1, wherein the reflective imagine optical system comprises:
- a first reflecting mirror;
- a second reflecting mirror;
- a third reflecting mirror;
- a fourth reflecting mirror;
- a fifth reflecting mirror; and
- a sixth reflecting mirror, each of the reflecting mirrors being arranged in an order in which the light from the first plane is incident on the each reflecting mirror.

9. The exposure optical system according to claim 8, wherein:
- the first, the second, the third, and the fourth reflecting mirrors form an intermediate image optically conjugate with the first plane based on the light from the first plane; and
- the fifth and the sixth reflecting mirrors form the image on the second plane based on the intermediate image.

10. The exposure optical system according to claim 8, wherein the first reflecting mirror has a concave reflecting surface, the second reflecting mirror has a convex or concave reflecting surface, the third reflecting mirror has a convex reflecting surface, and the fourth reflecting mirror has a concave reflecting surface.

11. The exposure optical system according to claim 10, wherein the fifth reflecting mirror has a convex reflecting surface and the sixth reflecting mirror has a concave reflecting surface.

12. The exposure optical system according to claim 8, further comprising an aperture stop which is arranged in an optical path between the second reflecting mirror and the third reflecting mirror.

13. The exposure optical system according to claim 1, wherein a reduced image of the pattern is formed on the second plane.

14. The exposure optical system according to claim 1, wherein the reflective imaging optical system is an optical system which is telecentric on a side of the second plane.

15. An exposure apparatus comprising the exposure optical system as defined in claim 1.

16. The exposure apparatus according to claim 15, wherein an exit pupil of the illumination optical system is coincident with an incident pupil of the reflective imaging optical system.

17. The exposure apparatus according to claim 16, wherein:
the illumination optical system comprises:
- a first fly's eye optical system, including the first reflecting optical elements; and
- a second fly's eye optical system, including a plurality of second reflecting optical elements arranged in parallel to correspond to the first reflecting optical elements, a reflecting surface of the first fly's eye optical system being arranged on the exit pupil of the illumination optical system.

18. The exposure apparatus according to claim 17, wherein a reflecting mirror having a power is not arranged in an optical path between the second fly's eye optical system and the first plane.

19. The exposure apparatus according to claim 15, wherein the light supplied from the light source is an EUV light having a wavelength of 5 nm to 40 nm, and
the image of the pattern is projected onto the photosensitive substrate to expose the photosensitive substrate by moving the pattern and the photosensitive substrate relative to the reflective imaging optical system.

20. A method for producing a device, comprising:
exposing the photosensitive substrate with the pattern by using the exposure apparatus as defined in claim 15;
developing the photosensitive substrate to which the image of the pattern has been transferred to form a mask layer, which has a shape corresponding to the pattern, on a surface of the photosensitive substrate; and
processing the surface of the photosensitive substrate via the mask layer.

* * * * *